United States Patent
Isobe et al.

(10) Patent No.: US 9,087,855 B2
(45) Date of Patent: Jul. 21, 2015

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventors: Atsuo Isobe, Isehara (JP); Toshinari Sasaki, Tochigi (JP); Junichi Koezuka, Tochigi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/474,516

(22) Filed: Sep. 2, 2014

(65) Prior Publication Data

US 2014/0370670 A1    Dec. 18, 2014

Related U.S. Application Data

(62) Division of application No. 13/463,092, filed on May 3, 2012, now Pat. No. 8,847,233.

(30) Foreign Application Priority Data

May 12, 2011    (JP) .................................. 2011-106877

(51) Int. Cl.
   *H01L 21/265*    (2006.01)
   *H01L 21/336*    (2006.01)
   (Continued)

(52) U.S. Cl.
   CPC .... *H01L 29/66477* (2013.01); *H01L 21/02565* (2013.01); *H01L 21/265* (2013.01);
   (Continued)

(58) Field of Classification Search
   CPC ................... H01L 29/66477; H01L 21/02565; H01L 21/425; H01L 27/1225; H01L 27/1203; H01L 27/10876
   See application file for complete search history.

(56) References Cited

U.S. PATENT DOCUMENTS

| 5,229,310 A | 7/1993 | Sivan |
| 5,407,846 A | 4/1995 | Chan |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Mary Wilczewski
*Assistant Examiner* — Toniae Thomas
(74) *Attorney, Agent, or Firm* — Eric J. Robinson; Robinson Intellectual Property Law Office, P.C.

(57) ABSTRACT

It is an object to provide a semiconductor device in which a short-channel effect is suppressed and miniaturization is achieved, and a manufacturing method thereof. A trench is formed in an insulating layer and impurities are added to an oxide semiconductor film in contact with an upper end corner portion of the trench, whereby a source region and a drain region are formed. With the above structure, miniaturization can be achieved. Further, with the trench, a short-channel effect can be suppressed setting the depth of the trench as appropriate even when a distance between a source electrode layer and a drain electrode layer is shortened.

20 Claims, 23 Drawing Sheets

(51) Int. Cl.
  *H01L 29/66* (2006.01)
  *H01L 21/84* (2006.01)
  *H01L 27/108* (2006.01)
  *H01L 27/115* (2006.01)
  *H01L 27/12* (2006.01)
  *H01L 49/02* (2006.01)
  *H01L 29/786* (2006.01)
  *H01L 21/425* (2006.01)
  *H01L 21/02* (2006.01)

(52) U.S. Cl.
  CPC .............. *H01L21/425* (2013.01); *H01L 21/84* (2013.01); *H01L 27/1085* (2013.01); *H01L 27/10876* (2013.01); *H01L 27/1156* (2013.01); *H01L 27/1203* (2013.01); *H01L 27/1225* (2013.01); *H01L 28/40* (2013.01); *H01L 29/66742* (2013.01); *H01L 29/66969* (2013.01); *H01L 29/7869* (2013.01)

(56) References Cited

U.S. PATENT DOCUMENTS

| | | | |
|---|---|---|---|
| 5,670,398 | A | 9/1997 | Yin et al. |
| 5,731,856 | A | 3/1998 | Kim et al. |
| 5,733,810 | A | 3/1998 | Baba et al. |
| 5,744,864 | A | 4/1998 | Cillessen et al. |
| 5,843,846 | A | 12/1998 | Nguyen et al. |
| 5,937,283 | A | 8/1999 | Lee |
| 6,001,734 | A | 12/1999 | Drynan |
| 6,008,505 | A | 12/1999 | Cho |
| 6,033,941 | A | 3/2000 | Yang |
| 6,107,662 | A | 8/2000 | Kim |
| 6,235,570 | B1 | 5/2001 | Kang |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,841,797 | B2 | 1/2005 | Isobe et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,439,545 | B2 | 10/2008 | Honda |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,463,399 | B2 | 12/2008 | Shin et al. |
| 7,468,304 | B2 | 12/2008 | Kaji et al. |
| 7,501,293 | B2 | 3/2009 | Ito et al. |
| 7,651,895 | B2 | 1/2010 | Shimada |
| 7,674,650 | B2 | 3/2010 | Akimoto et al. |
| 7,732,819 | B2 | 6/2010 | Akimoto et al. |
| 7,755,126 | B2 | 7/2010 | Kondo |
| 7,777,414 | B2 | 8/2010 | Honda |
| 7,859,021 | B2 | 12/2010 | Kaneko |
| 8,034,674 | B2 | 10/2011 | Nagai et al. |
| 8,188,472 | B2 | 5/2012 | Park et al. |
| 8,202,365 | B2 | 6/2012 | Umeda et al. |
| 8,247,813 | B2 | 8/2012 | Koyama et al. |
| 8,274,078 | B2 | 9/2012 | Itagaki et al. |
| 8,293,661 | B2 | 10/2012 | Yamazaki |
| 8,324,621 | B2 | 12/2012 | Yamazaki et al. |
| 8,367,489 | B2 | 2/2013 | Yamazaki |
| 8,377,744 | B2 | 2/2013 | Yamazaki et al. |
| 8,492,758 | B2 | 7/2013 | Yamazaki et al. |
| 8,530,285 | B2 | 9/2013 | Yamazaki et al. |
| 8,587,048 | B2 | 11/2013 | Park et al. |
| 2001/0046027 | A1 | 11/2001 | Tai et al. |
| 2002/0000619 | A1 | 1/2002 | Einav |
| 2002/0056838 | A1 | 5/2002 | Ogawa |
| 2002/0132454 | A1 | 9/2002 | Ohtsu et al. |
| 2003/0170955 | A1 | 9/2003 | Kawamura et al. |
| 2003/0189401 | A1 | 10/2003 | Kido et al. |
| 2003/0201473 | A1 | 10/2003 | Liu et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2004/0248387 | A1 | 12/2004 | Kawasaki et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0023698 | A1 | 1/2008 | Li et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0057649 | A1 | 3/2008 | Schuele et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0121877 | A1 | 5/2008 | Ender et al. |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0220620 | A1 | 9/2008 | Kawada et al. |
| 2008/0224133 | A1 | 9/2008 | Park et al. |
| 2008/0246088 | A1 | 10/2008 | Schuele et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0001436 | A1 | 1/2009 | Kondo |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0127552 | A1 | 5/2009 | Li et al. |
| 2009/0134399 | A1 | 5/2009 | Sakakura et al. |
| 2009/0146261 | A1 | 6/2009 | Onodera et al. |
| 2009/0152506 | A1 | 6/2009 | Umeda et al. |
| 2009/0152541 | A1 | 6/2009 | Maekawa et al. |

(56) References Cited

U.S. PATENT DOCUMENTS

| | | |
|---|---|---|
| 2009/0278122 A1 | 11/2009 | Hosono et al. |
| 2009/0280600 A1 | 11/2009 | Hosono et al. |
| 2009/0286351 A1 | 11/2009 | Hirao et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0155720 A1 | 6/2010 | Kaneko |
| 2010/0320458 A1 | 12/2010 | Umeda et al. |
| 2010/0320459 A1 | 12/2010 | Umeda et al. |
| 2011/0062436 A1 | 3/2011 | Yamazaki et al. |
| 2011/0108837 A1 | 5/2011 | Yamazaki et al. |
| 2011/0127521 A1 | 6/2011 | Yamazaki |
| 2011/0127523 A1 | 6/2011 | Yamazaki |
| 2011/0127579 A1 | 6/2011 | Yamazaki |
| 2011/0133191 A1 | 6/2011 | Yamazaki |
| 2011/0147739 A1 | 6/2011 | Yamazaki et al. |
| 2011/0151618 A1 | 6/2011 | Yamazaki et al. |
| 2011/0260284 A1 | 10/2011 | Schrank et al. |
| 2011/0284848 A1 | 11/2011 | Yamazaki |
| 2012/0052606 A1 | 3/2012 | Yamazaki |
| 2012/0061663 A1 | 3/2012 | Yamazaki et al. |
| 2012/0064664 A1 | 3/2012 | Yamazaki et al. |
| 2012/0064703 A1 | 3/2012 | Jintyou et al. |
| 2012/0187410 A1 | 7/2012 | Yamazaki et al. |
| 2012/0187417 A1 | 7/2012 | Yamazaki et al. |
| 2012/0187475 A1 | 7/2012 | Yamazaki et al. |
| 2012/0267623 A1 | 10/2012 | Isobe et al. |
| 2012/0267624 A1 | 10/2012 | Isobe et al. |
| 2012/0267696 A1 | 10/2012 | Isobe et al. |
| 2012/0267709 A1 | 10/2012 | Isobe et al. |
| 2012/0270375 A1 | 10/2012 | Sasagawa et al. |

FOREIGN PATENT DOCUMENTS

| | | |
|---|---|---|
| JP | 60-198861 A | 10/1985 |
| JP | 62-102517 A | 5/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-181164 A | 7/1993 |
| JP | 05-251705 A | 9/1993 |
| JP | 08-264794 A | 10/1996 |
| JP | 09-232447 A | 9/1997 |
| JP | 11-505377 | 5/1999 |
| JP | 2000-044236 A | 2/2000 |
| JP | 2000-150900 A | 5/2000 |
| JP | 2000-164875 A | 6/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-016368 A | 1/2009 |
| WO | WO-2004/114391 | 12/2004 |
| WO | WO-2008/133345 | 11/2008 |

OTHER PUBLICATIONS

Dembo.H et al., "RFCPUS on Glass and Plastic Substrates Fabricated by TFT Transfer Technology", IEDM 05: Technical Deigest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m =7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ As a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Diplays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

(56) References Cited

OTHER PUBLICATIONS

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transistion: The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "Suftla Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of; Challenges to, and Perspective View of AM-OLED ", IDW '06: Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 18, pp. 1216-1219.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID Intenational Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest of '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

(56) References Cited

OTHER PUBLICATIONS

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

10nm

10nm

3nm

3nm

In
Ga
Zn
O

- In
- ◐ Sn
- ◡ Zn
- • O

SEMICONDUCTOR DEVICE AND MANUFACTURING METHOD THEREOF

BACKGROUND OF THE INVENTION

1. Field of the Invention

The invention disclosed in this specification relates to a semiconductor device utilizing a semiconductor element and a manufacturing method thereof.

2. Description of the Related Art

Attention has been focused on a technique of using a semiconductor thin film formed over a substrate having an insulating surface to form a transistor. The transistor is applied to a wide range of electronic devices such as an integrated circuit (IC) or an image display device (display device). Further, a technique of using an oxide semiconductor for a semiconductor thin film that can be used for a transistor has been attracting attention.

For example, it has been confirmed that an oxide semiconductor containing an In—Ga—Zn-based oxide is applicable to a channel formation region of a thin film transistor (Patent Document 1).

REFERENCE

[Patent Document 1] Japanese Published Patent Application No. 2004-103957

SUMMARY OF THE INVENTION

In order to achieve high-speed operation of a transistor, low power consumption of a transistor, high integration, cost reduction, or the like, it is essential to miniaturize a transistor.

In the case where a transistor is miniaturized, a problem of a short-channel effect is caused. The short-channel effect refers to degradation of electric characteristics which becomes obvious along with miniaturization of a transistor (reduction in channel length). The short-channel effect results from the effect of an electric field of a drain on a source. Specific examples of the short-channel effect are a decrease in threshold voltage, an increase in S value (subthreshold swing), an increase in leakage current, and the like.

Further, in the case of a transistor having a structure in which a source electrode layer and a drain electrode layer are directly in contact with an oxide semiconductor film used for a channel formation region, contact resistance might be high and on-state current might be reduced. One of the conceivable factors causing high contact resistance is Schottky junction which is formed at the interface between the oxide semiconductor film and the source and the drain electrode layers.

In the view of the above, it is an object of one embodiment of the disclosed present invention to provide a semiconductor device in which a short-channel effect is suppressed and miniaturization is achieved, and a manufacturing method thereof. It is another object of one embodiment of the disclosed present invention to provide a semiconductor device in which resistance between an oxide semiconductor film and source and drain electrode layers is reduced so that an excellent ohmic contact can be obtained, and a manufacturing method thereof.

In a transistor (semiconductor device) including an oxide semiconductor film, the oxide semiconductor film is formed in a trench (groove) provided in an insulating layer. The oxide semiconductor film includes a crystal having the c-axis, which is substantially perpendicular to a surface of the oxide semiconductor film, at least in a region in contact with the bottom surface, a lower end corner portion, and part of a side surface of the trench. The region is used as a channel formation region. The oxide semiconductor film further includes a region whose impurity concentration is higher than that of the channel formation region is formed in a region in contact with an upper end corner portion of the trench. The region is used as a source region or a drain region.

In one embodiment of the present invention, a semiconductor device includes an insulating layer including a first region having a first thickness, a second region having a second thickness which is smaller than the first thickness, and a trench including a side surface and a bottom surface formed over the second region; an oxide semiconductor film which includes a source region, a drain region, and a channel formation region and which is provided in contact with the bottom surface and the side surface of the trench and a top surface of the first region; a source electrode layer and a drain electrode layer which are electrically connected to the source region and the drain region; a gate insulating layer provided over the oxide semiconductor film, the source electrode layer, and the drain electrode layer; and a gate electrode layer which is provided over the gate insulating layer and which fills the trench. The channel formation region includes a crystal having a c-axis, which is substantially perpendicular to a surface of the oxide semiconductor film, and is in contact with the side surface and the bottom surface of the trench. The source region and the drain region have higher impurity concentrations than the channel formation region and are each in contact with the top surface of the first region and an upper end corner portion where the top surface of the first region intersects the side surface of the trench.

In another embodiment of the present invention, a region whose impurity concentration is higher than impurity concentrations of the source region and the drain region is preferably included in the oxide semiconductor film which does not overlap with the source electrode layer, the drain electrode layer, and the gate electrode layer.

In another embodiment of the present invention, a lower end corner portion where the bottom surface of the trench intersects the side surface of the trench preferably has a curved surface with a radius of curvature greater than or equal to 20 nm and less than or equal to 60 nm.

In another embodiment of the present invention, parts of the source region and the drain region may overlap with the gate electrode layer in the semiconductor device.

In another embodiment of the present invention, a method for manufacturing a semiconductor device includes the following steps: forming an insulating layer including a first region having a first thickness, a second region having a second thickness which is smaller than the first thickness, and a trench including a side surface and a bottom surface formed over the second region; forming an oxide semiconductor film in contact with the bottom surface and the side surface of the trench and a top surface of the first region and forming at least a region which is in contact with the side surface and the bottom surface of the trench to include a crystal having a c-axis which is substantially perpendicular to a surface of the oxide semiconductor film while the oxide semiconductor film is heated; forming a source region and a drain region in contact with the top surface of the first region and an upper end corner portion where the top surface of the first region intersects the side surface of the trench and forming a channel formation region in contact with the side surface and the bottom surface of the trench by adding impurities obliquely with respect to a normal direction of the top surface of the first region; forming a source electrode layer and a drain electrode layer which are electrically connected to the source region and the drain region; forming a gate insulating layer over the oxide semiconductor film, the source electrode layer, and the drain electrode layer; and forming a gate electrode layer which is over the gate insulating layer and which fills the trench. The source region and the drain region have higher impurity concentrations than the channel formation region.

In another embodiment of the present invention, a method for manufacturing a semiconductor device includes the following steps: forming an insulating layer including a first region having a first thickness, a second region having a second thickness which is smaller than the first thickness, and a trench including a side surface and a bottom surface formed over the second region; forming an amorphous oxide semiconductor film in contact with the bottom surface and the side surface of the trench and a top surface of the first region; forming at least a region which is in contact with the side surface and the bottom surface of the trench to include a crystal having a c-axis which is substantially perpendicular to the region by heating the amorphous oxide semiconductor film; forming a source region and a drain region in contact with the top surface of the first region and an upper end corner portion where the top surface of the first region intersects the side surface of the trench and forming a channel formation region in contact with the side surface and the bottom surface of the trench by adding impurities obliquely with respect to a normal direction of the top surface of the first region; forming a source electrode layer and a drain electrode layer which are electrically connected to the source region and the drain region; forming a gate insulating layer over the oxide semiconductor film, the source electrode layer, and the drain electrode layer; and forming a gate electrode layer which is over the gate insulating layer and which fills the trench. The source region and the drain region have higher impurity concentrations than the channel formation region.

In another embodiment of the present invention, a method for manufacturing a semiconductor device includes the following steps: forming an insulating layer including a first region having a first thickness, a second region having a second thickness which is smaller than the first thickness, and a trench including a side surface and a bottom surface formed over the second region; forming an oxide semiconductor film in contact with the bottom surface and the side surface of the trench and a top surface of the first region and forming at least a region which is in contact with the side surface and the bottom surface of the trench to include a crystal having a c-axis which is substantially perpendicular to a surface of the oxide semiconductor film while the oxide semiconductor film is heated; forming a source electrode layer and a drain electrode layer; forming a gate insulating layer over the oxide semiconductor film, the source electrode layer, and the drain electrode layer; forming a gate electrode layer which fills the trench and which is over the gate insulating layer so as to overlap with the trench; and forming a source region and a drain region in contact with the top surface of the first region and an upper end corner portion, where the top surface of the first region intersects the side surface of the trench and forming a channel formation region in contact with the side surface and the bottom surface of the trench by adding impurities through the gate electrode layer after the formation of the gate electrode layer. The source region and the drain region have higher impurity concentrations than the channel formation region.

In another embodiment of the present invention, a method for manufacturing a semiconductor device includes the following steps: forming an insulating layer including a first region having a first thickness, a second region having a second thickness which is smaller than the first thickness, and a trench including a side surface and a bottom surface formed over the second region; forming an amorphous oxide semiconductor film in contact with the bottom surface and the side surface of the trench and a top surface of the first region; forming a source electrode layer and a drain electrode layer; forming a gate insulating layer over the oxide semiconductor film, the source electrode layer, and the drain electrode layer; forming a gate electrode layer which fills the trench and which is over the gate insulating layer so as to overlap with the trench; forming a source region and a drain region in contact with the top surface of the first region and an upper end corner portion, where the top surface of the first region intersects the side surface of the trench and forming a channel formation region in contact with the side surface and the bottom surface of the trench by adding impurities through the gate electrode layer after the formation of the gate electrode layer; and forming at least a region which is in contact with the side surface and the bottom surface of the trench to include a crystal having a c-axis which is substantially perpendicular to the region by heating the amorphous oxide semiconductor film after any one of a series of steps from the step of forming the amorphous oxide semiconductor film to the step of forming the gate electrode layer. The source region and the drain region have higher impurity concentrations than the channel formation region.

In another embodiment of the present invention, a method for manufacturing a semiconductor device includes the following steps: forming an insulating layer including a first region having a first thickness, a second region having a second thickness which is smaller than the first thickness, and a trench including a side surface and a bottom surface formed over the second region; forming an oxide semiconductor film in contact with the bottom surface and the side surface of the trench and a top surface of the first region and forming at least a region which is in contact with the side surface and the bottom surface of the trench to include a crystal having a c-axis which is substantially perpendicular to a surface of the oxide semiconductor film while the oxide semiconductor film is heated; forming a resist mask covering the side surface and the bottom surface of the trench; adding impurities to the oxide semiconductor film; forming a source region and a drain region in contact with the top surface of the first region and an upper end corner portion and forming a channel formation region in contact with the side surface and the bottom surface of the trench; removing the resist mask; forming a source electrode layer and a drain electrode layer which are electrically connected to the source region and the drain region; forming a gate insulating layer over the oxide semiconductor film, the source electrode layer, and the drain electrode layer; and forming a gate electrode layer which fills the trench and which is over the gate insulating layer so as to overlap with the trench. The source region and the drain region have higher impurity concentrations than the channel formation region.

In another embodiment of the present invention, a method for manufacturing a semiconductor device includes the following steps: forming an insulating layer including a first region having a first thickness, a second region having a second thickness which is smaller than the first thickness, and a trench including a side surface and a bottom surface formed over the second region; forming an amorphous oxide semiconductor film in contact with the bottom surface and the side surface of the trench and a top surface of the first region; forming a resist mask which covers the side surface and the bottom surface of the trench and which is in contact with the oxide semiconductor film; adding impurities to the oxide semiconductor film; forming a source region and a drain region in contact with the top surface of the first region and an upper end corner portion where the top surface of the first region intersects the side surface of the trench and forming a channel formation region in contact with the side surface and the bottom surface of the trench; removing the resist mask; forming a source electrode layer and a drain electrode layer which are electrically connected to the source region and the drain region; forming a gate insulating layer over the oxide semiconductor film, the source electrode layer, the drain electrode layer; forming a gate electrode layer over the gate insulating layer, which fills the trench; and forming at least a region which is in contact with the side surface and the bottom surface of the trench to include a crystal having a c-axis which is substantially perpendicular to the region by heating the amorphous oxide semiconductor film after the step of forming the amorphous oxide semiconductor film or the step of forming the resist mask. The source region and the drain region have higher impurity concentrations than the channel formation region.

In another embodiment of the present invention, when the source region and the drain region are formed with the use of the resist mask, impurities are preferably added by a plasma immersion ion implantation method or a plasma based ion implantation method.

Note that in this specification and the like, the term such as "over" or "below" does not necessarily mean that a component is placed "directly on" or "directly under" another component. For example, the expression "a gate electrode layer over an insulating layer" does not exclude the case where there is an additional component between the insulating layer and the gate electrode layer.

In addition, in this specification and the like, the term such as "electrode" or "wiring" does not limit a function of a component. For example, an "electrode" is sometimes used as part of a "wiring", and vice versa. Further, the term "electrode" or "wiring" can also mean a combination of a plurality of "electrodes" and "wirings", for example.

Functions of a "source" and a "drain" are sometimes replaced with each other when a transistor of opposite polarity is used or when the direction of current flowing is changed in circuit operation, for example. Thus, the terms "source" and "drain" can be replaced with each other in this specification.

Note that in this specification and the like, the term "electrically connected" includes the case where components are connected through an "object having any electric function". There is no particular limitation on an "object having any electric function" as long as electric signals can be transmitted and received between components that are connected through the object.

Examples of an "object having any electric function" are an electrode and a wiring.

In this specification and the like, average surface roughness ($R_a$) is obtained by three-dimension expansion of center line average roughness ($R_a$) which is defined by JISB0601:2001 (ISO 4287:1997) so that $R_a$ can be applied to a measurement surface, and is an average value of the absolute values of deviations from a reference surface to a specific surface.

Here, the center line average roughness ($R_a$) is shown by the following Formula 1 when a portion having a measurement length $L_0$ is picked up from a roughness curve in the direction of the center line of the roughness curve, the direction of the center line of the roughness curve of the picked portion is an x-axis, the direction of longitudinal magnification (direction perpendicular to the x-axis) is a y-axis, and the roughness curve is expressed as y=f(x).

[Formula 1]

$$R_a = \frac{1}{L_0} \int_0^{L_0} |f(x)| dx \quad (1)$$

When the measurement surface which is a surface represented by measurement data is expressed as z=f(x, y), the average surface roughness ($R_a$) is an average value of the absolute values of deviations from the reference surface to the specific surface and is shown by the following Formula 2.

[Formula 2]

$$R_a = \frac{1}{S_0} \int_{y_1}^{y_2} \int_{x_1}^{x_2} |f(x, y) - Z_0| dx dy \quad (2)$$

Here, the specific surface is a surface which is a target of roughness measurement, and is a quadrangular region which is specified by four points represented by the coordinates ($x_1$, $y_1$), ($x_1$, $y_2$), ($x_2$, $y_1$), and ($x_2$, $y_2$). The area of the specific surface when the specific surface is flat ideally is denoted by $S_0$.

In addition, the reference surface refers to a surface parallel to an x-y surface at the average height of the specific surface. That is, when the average value of the height of the specific surface is denoted by $Z_0$, the height of the reference surface is also denoted by $Z_0$.

According to one embodiment of the disclosed invention, a semiconductor device in which a short-channel effect is suppressed and miniaturization is achieved, and a manufacturing method thereof can be provided. Further, a semiconductor device in which resistance between an oxide semiconductor film and source and drain electrode layers is reduced so that an excellent ohmic contact can be obtained, and a manufacturing method thereof can be provided.

Further, according to one embodiment of the disclosed invention, the size of a transistor can be sufficiently reduced. When the size of the transistor is sufficiently reduced, the area of a semiconductor device is also reduced and thus the number of semiconductor devices manufactured from one substrate is increased. Accordingly, manufacturing cost of per semiconductor device can be reduced. Since the semiconductor device is downsized, a semiconductor device with a size similar to that of the conventional semiconductor device can have improved functions. In other words, the semiconductor device can be highly integrated. Further, effects of high-speed operation, low power consumption, and the like can be obtained because of a reduction in channel length.

DETAILED DESCRIPTION OF THE INVENTION

Figure 1A:
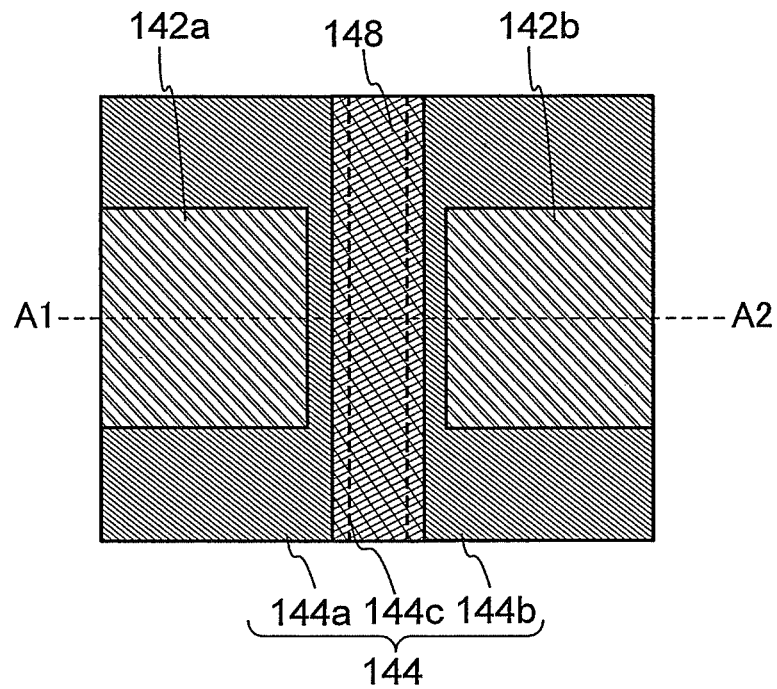
FIGS. 1A and 1B are a plan view and a cross-sectional view illustrating a semiconductor device according to one embodiment of the present invention.

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Thus, the invention should not be construed as being limited to the description in the following embodiments. In the following embodiments and an example, the same portions or portions having similar functions are denoted by the same reference numerals in different drawings, and explanation thereof will not be repeated.

Note that the position, size, range, or the like of each structure illustrated in the drawings and the like is not accurately represented in some cases for easy understanding. Thus, the disclosed invention is not necessarily limited to the position, size, range, or the like as disclosed in the drawings and the like.

Note that in this specification and the like, ordinal numbers such as "first", "second", and "third" are used in order to avoid confusion among components and do not limit the number.

Embodiment 1

In this embodiment, an example of a structure of a semiconductor device and a manufacturing process thereof according to one embodiment of the disclosed invention will be described with reference to FIGS. 1A and 1B, FIGS. 2A to 2C, and FIGS. 3A to 3C.

Figure 1B:
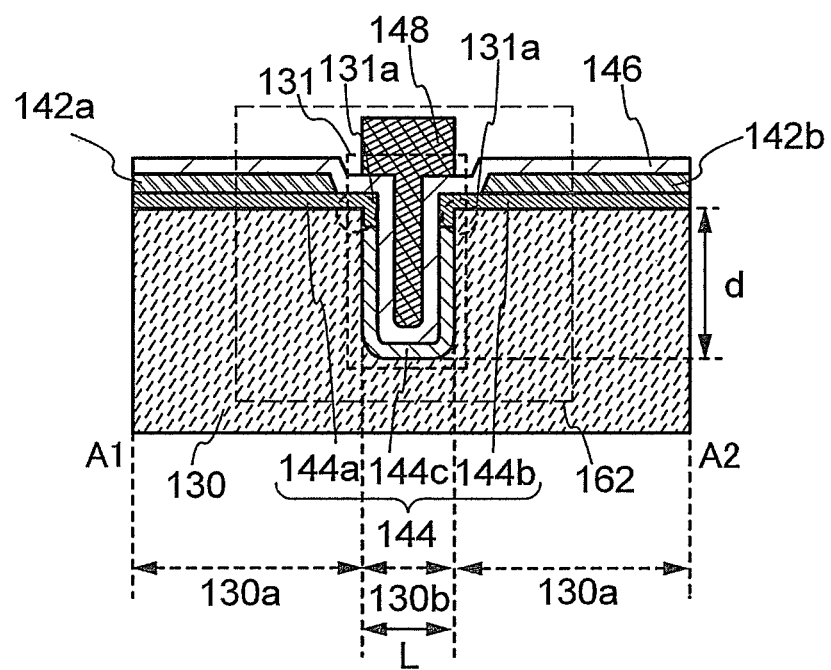

FIG. 1A illustrates an example of a plan view of a transistor 162 in this embodiment. FIG. 1B illustrates a cross-sectional view taken along chain line A1-A2 in FIG. 1A.

The transistor 162 described in this embodiment includes an insulating layer 130 provided with a trench 131; an oxide semiconductor film 144 including a source region 144a, a drain region 144b, and a channel formation region 144c; a source electrode layer 142a and a drain electrode layer 142b; a gate insulating layer 146; and a gate electrode layer 148.

Here, a positional relation and a connection relation of the above components will be described.

The insulating layer 130 includes first regions 130a having a first thickness and a second region 130b having a thickness smaller than the first thickness. The second region 130b is provided between the first regions 130a. The bottom surface and side surfaces of the trench 131 are formed with the second region 130b and the first regions 130a, respectively.

In this specification and the like, a portion where the top surface of the first region 130a intersects the side surface of the trench 131 is defined as an "upper end corner portion", and a portion where the bottom surface of the trench 131 intersects the side surface of the trench 131 is defined as a "lower end corner portion". The upper end corner portion and the lower end corner portion each include a peripheral portion thereof.

The oxide semiconductor film 144 is formed in contact with the bottom surface and the side surface of the trench 131 and the top surface of the first region 130a. The source region 144a and the drain region 144b in the oxide semiconductor film 144 are each in contact with an upper end corner portion 131a where the top surface of the first region 130a intersects the side surface of the trench 131. The channel formation region 144c in the oxide semiconductor film 144 is in contact with the bottom surface of the trench 131 and the side surface of the trench 131, which excludes the upper end corner portion 131a. The channel formation region 144c includes a crystal having the c-axis which is substantially perpendicular to a surface of the oxide semiconductor film 144. The source region 144a and the drain region 144b have higher impurity concentrations than the channel formation region 144c.

The source electrode layer 142a and the drain electrode layer 142b are electrically connected to the source region 144a and the drain region 144b, respectively. The gate insulating layer 146 is provided over the oxide semiconductor film 144, the source electrode layer 142a, and the drain electrode layer 142b. The gate electrode layer 148 is provided over the gate insulating layer 146 and fills the trench 131.

Next, details of the components will be described.

The trench 131 is provided in the insulating layer 130 and the oxide semiconductor film 144 is provided in contact with the trench 131. Accordingly, the cross-sectional shape of the oxide semiconductor film 144 in the channel-length direction (direction of carrier flow) is a shape curved along the cross-sectional shape of the trench 131. With this structure, as the depth d of the trench 131 is greater, an effective channel length of the transistor 162 can be increased. Here, the trench 131 is preferably provided so that the effective channel length is greater than or equal to 2 L with respect to the length L in the channel-length direction of the trench 131.

The channel formation region of the oxide semiconductor film 144 can be extended in a three dimensional direction (direction perpendicular to a substrate) by appropriately determining the depth d of the trench 131. Thus, even when the distance between the source electrode layer 142a and the drain electrode layer 142b is shortened to miniaturize the transistor 162, the effective channel length can be kept or extended. Accordingly, miniaturization of the transistor 162 can be achieved and a short-channel effect of the transistor 162 can be suppressed.

Thus, the size of the transistor 162 can be sufficiently reduced, which leads to a reduction in the area of a semiconductor device and an increase in the number of semiconductor devices manufactured from one substrate. Accordingly, manufacturing cost of per semiconductor device can be reduced. Since the semiconductor device is downsized, a semiconductor device with a size similar to that of the conventional semiconductor device can have improved functions. In other words, the semiconductor device can be highly integrated. Further, effects of high-speed operation, low power consumption, and the like can be obtained because of a reduction in channel length.

In the trench 131 provided in the insulating layer 130, a curved surface is formed at the lower end corner portion. The curved surface at the lower end corner portion preferably has a radius of curvature greater than or equal to 20 nm and less than or equal to 60 nm. Further, a surface of the lower end corner portion is preferably as even as possible and the average surface roughness is preferably less than 0.5 nm, further preferably less than or equal to 0.3 nm, still further preferably less than or equal to 0.1 nm. Note that the average surface roughness is preferably close to 0. When an region including a crystal having the c-axis which is substantially perpendicular to the surface of the oxide semiconductor film 144 to be described later is provided in contact with the trench 131 including such a lower end corner portion, a change in electric characteristics of the oxide semiconductor film due to irradiation with visible light or ultraviolet light can be prevented.

Here, at least the channel formation region 144c of the oxide semiconductor film 144 included in the transistor 162 has crystallinity and is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

Here, an example of a crystal structure of the CAAC-OS film will be described in detail with reference to FIGS. 16A to 16E, FIGS. 17A to 17C, and FIGS. 18A to 18C. In FIGS. 16A to 16E, FIGS. 17A to 17C, and FIGS. 18A to 18C, the vertical direction corresponds to the c-axis direction and a plane perpendicular to the c-axis direction corresponds to the a-b plane, unless otherwise specified. When the expressions "upper half" and "lower half" are simply used, they refer to an upper half above the a-b plane and a lower half below the a-b plane (an upper half and a lower half with respect to the a-b plane). Further, in FIGS. 16A to 16E, O surrounded by a circle represents a tetracoordinate O atom and O surrounded by a double circle represents a tricoordinate O atom.

Figure 16A:
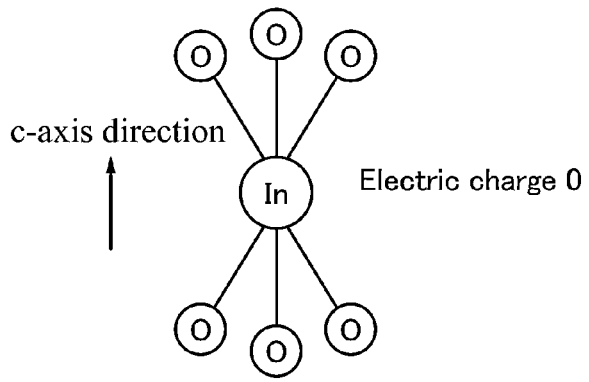
FIGS. 16A to 16E are diagrams each illustrating a structure of an oxide material according to one embodiment of the present invention.

FIG. 16A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 16A is actually an octahedral structure, but is shown as a planar structure for easy understanding. Note that three tetracoordinate O atoms exist in each of an upper half and a lower half in FIG. 16A. In the small group illustrated in FIG. 16A, charge is 0.

Figure 16D:
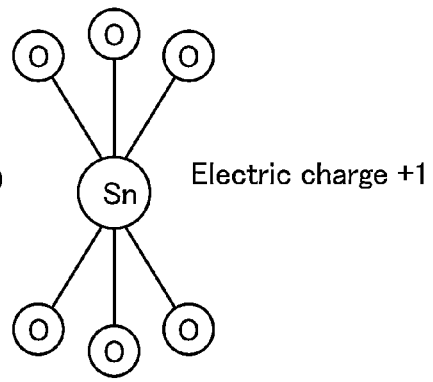
Figure 16B:
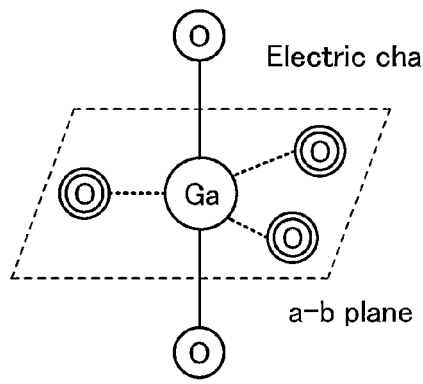

FIG. 16B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 16B. An In atom can also have the structure illustrated in FIG. 16B because an In atom can have five ligands. In the small group illustrated in FIG. 16B, charge is 0.

Figure 16E:
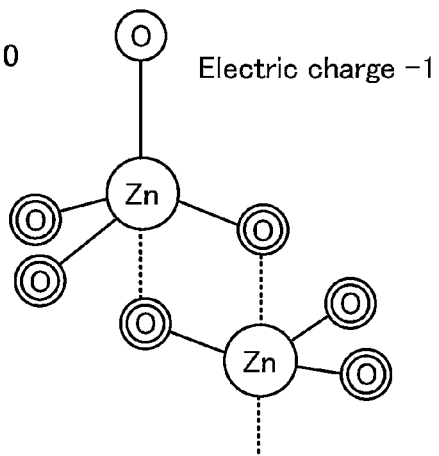
Figure 16C:
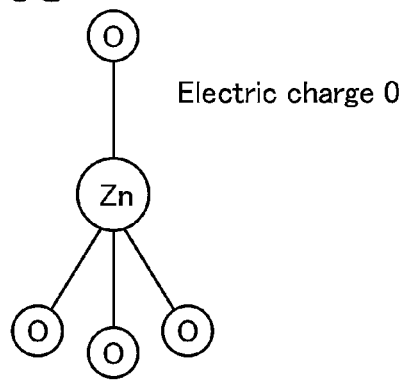

FIG. 16C illustrates a structure including one tetracoordinate Zn atom and four tetracoordinate O atoms proximate to the Zn atom. In FIG. 16C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 16C. In the small group illustrated in FIG. 16C, charge is 0.

FIG. 16D illustrates a structure including one hexacoordinate Sn atom and six tetracoordinate O atoms proximate to the Sn atom. In FIG. 16D, three tetracoordinate O atoms exist in each of an upper half and a lower half. In the small group illustrated in FIG. 16D, charge is +1.

FIG. 16E illustrates a small group including two Zn atoms. In FIG. 16E, one tetracoordinate O atom exists in each of an upper half and a lower half. In the small group illustrated in FIG. 16E, charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 16A each have three proximate In atoms in the downward direction, and the three O atoms in the lower half each have three proximate In atoms in the upward direction. The one O atom in the upper half with respect to the pentacoordinate Ga atom in FIG. 16B has one proximate Ga atom in the downward direction, and the one O atom in the lower half has one proximate Ga atom in the upward direction. The one O atom in the upper half with respect to the tetracoordinate Zn atom in FIG. 16C has one proximate Zn atom in the downward direction, and the three O atoms in the lower half each have three proximate Zn atoms in the upward direction. Similarly, the number of the tetracoordinate O atoms below the metal atom is equal to the number of the metal atoms proximate to and above each of the tetracoordinate O atoms. Since the coordination number of the tetracoordinate O atom is four, the sum of the number of the metal atoms proximate to and below the O atom and the number of the metal atoms proximate to and above the O atom is four. Thus, when the sum of the number of tetracoordinate O atoms above a metal atom and the number of tetracoordinate O atoms below another metal atom is four, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom having the above coordination number is bonded to another metal atom having the above coordination number through a tetracoordinate O atom in the c-axis direction. In addition to the above, a medium group can be formed in a different manner by combining a plurality of small groups so that the total charge of the layered structure is 0.

Figure 17A:
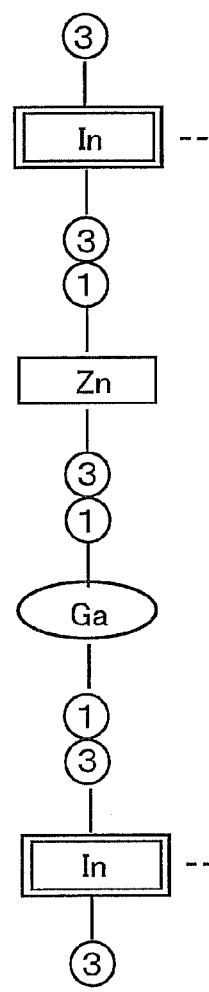
FIGS. 17A to 17C are diagrams illustrating a structure of an oxide material according to one embodiment of the present invention.
Figure 17B:
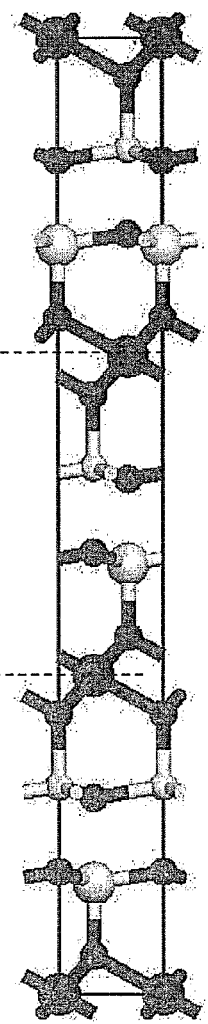
Figure 17C:
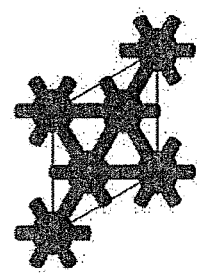

FIG. 17A illustrates a model of a medium group included in a layered structure of an In—Ga—Zn-based oxide. FIG. 17B illustrates a large group including three medium groups. Note that FIG. 17C illustrates an atomic arrangement in the case where the layered structure in FIG. 17B is observed from the c-axis direction.

In FIG. 17A, for easy understanding, a tricoordinate O atom is omitted and tetracoordinate O atoms are shown by a circle; the number in the circle shows the number of tetracoordinate O atoms. For example, three tetracoordinate O atoms existing in each of an upper half and a lower half with respect to an In atom are denoted by circled 3. Similarly, in FIG. 17A, one tetracoordinate O atom existing in each of an upper half and a lower half with respect to a Ga atom is denoted by circled 1. FIG. 17A also illustrates a Zn atom proximate to one tetracoordinate O atom in an upper half and three tetracoordinate O atoms in a lower half.

In the medium group included in the layered structure of an In—Ga—Zn-based oxide in FIG. 17A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

Here, charge for one bond of a tricoordinate O atom and charge for one bond of a tetracoordinate O atom can be assumed to be −0.667 and −0.5, respectively. For example, since charge of a (hexacoordinate or pentacoordinate) In atom, charge of a (tetracoordinate) Zn atom, and charge of a (pentacoordinate) Ga atom are +3, +2, +3, respectively, charge of a small group including any of an In atom, a Zn atom, and a Ga atom is 0. As a result, the total charge of a medium group having a combination of such small groups is always 0.

In order to form the layered structure of an In—Ga—Zn-based oxide, a large group can be formed using not only the medium group illustrated in FIG. 17A but also a medium group in which the arrangement of the In atom, the Ga atom, and the Zn atom is different from that in FIG. 17A.

The above-described rule also applies to the following oxides: a four-component metal oxide such as an In—Sn—Ga—Zn-based oxide; a three-component metal oxide such as an In—Sn—Zn-based oxide, an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 18A:
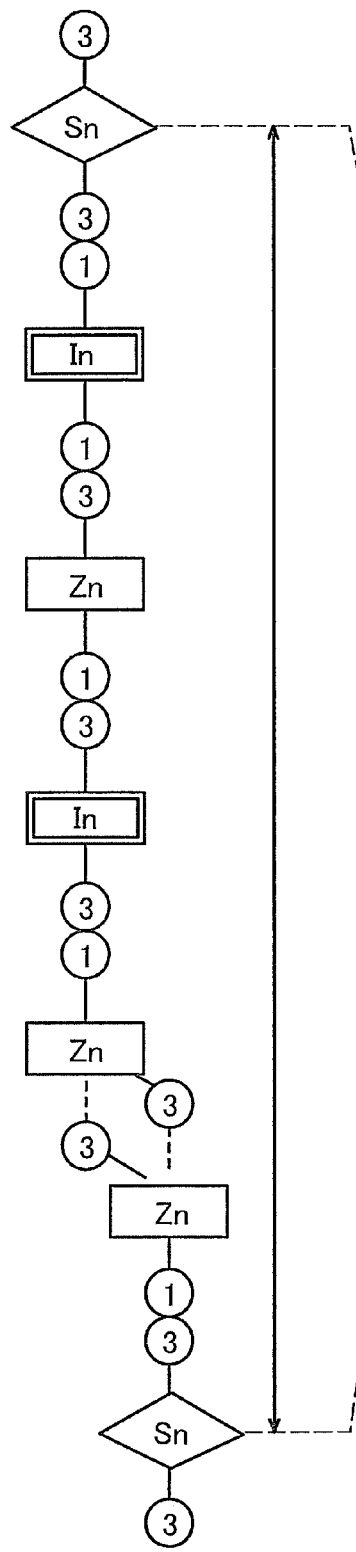
FIGS. 18A to 18C are diagrams illustrating a structure of an oxide material according to one embodiment of the present invention.

As an example, FIG. 18A illustrates a model of a medium group included in a layered structure of an In—Sn—Zn-based oxide.

In the group included in the layered structure of an In—Sn—Zn-based oxide in FIG. 18A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, charge of a (hexacoordinate or pentacoordinate) In atom, charge of a (tetracoordinate) Zn atom, and charge of a (pentacoordinate or hexacoordinate) Sn atom are +3, +2, and +4, respectively. Accordingly, charge in a small group including a Sn atom is +1. Therefore, charge of −1, which cancels +1, is needed to form a layered structure including a Sn atom. As a structure having charge of −1, the small group including two Zn atoms as illustrated in FIG. 18A can be given. For example, with one small group including two Zn atoms, charge of one small group including a Sn atom can be cancelled, so that the total charge of the layered structure can be 0.

Figure 18B:
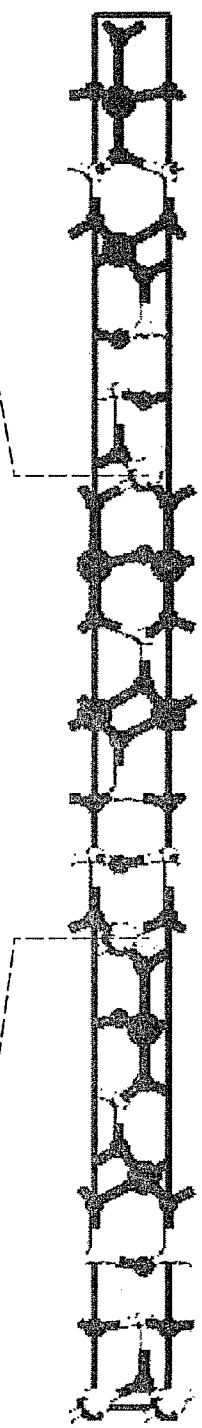
Figure 18C:
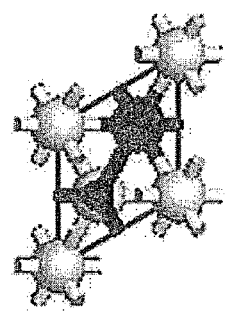

When the large group illustrated in FIG. 18B is repeated, a crystal of an In—Sn—Zn-based oxide ($In_2SnZn_3O_8$) can be obtained. Note that the layered structure of an In—Sn—Zn-based oxide which is obtained can be expressed as a composition formula, $In_2SnZn_2O_7(ZnO)_m$ (m is 0 or a natural number).

When a CAAC-OS film is used for the channel formation region 144c, a change in electric characteristics due to irradiation with visible light or ultraviolet light can be prevented.

Since the upper end corner portions 131a are sharp corner portions, in regions of the oxide semiconductor film 144, which are formed in contact with the upper end corner portions 131a where parts of the source region 144a and the drain region 144b are formed, a growth surface of a crystal having the c-axis which is substantially perpendicular to a surface of the CAAC-OS film in the oxide semiconductor film 144 might have low continuity. However, when the regions of the oxide semiconductor film 144, which are in contact with the upper end corner portions 131a, are used for the source region 144a and the drain region 144b as in this embodiment, a growth surface of a crystal having the c-axis which is substantially perpendicular to the surface of the oxide semiconductor film 144 are continuous in the whole channel formation region 144c. Thus, the transistor can have more stable electric characteristics.

The source region 144a and the drain region 144b have higher impurity concentrations than the channel formation region 144c. Accordingly, for example, an impurity P enters a lattice position of oxygen in an oxide semiconductor and bonds to a metal M and oxygen in the oxide semiconductor, so that an M-POx bond is formed. As a result, an oxygen vacancy is induced in the oxide semiconductor, carriers are generated, and contact resistance is reduced; thus, excellent ohmic contact can be obtained between the oxide semiconductor film 144 and the source electrode layer 142a and the drain electrode layer 142b.

With such a structure, a semiconductor device having stable electric characteristics and high reliability can be provided.

An example of a manufacturing process of the transistor 162 is described below.

Figure 2A:
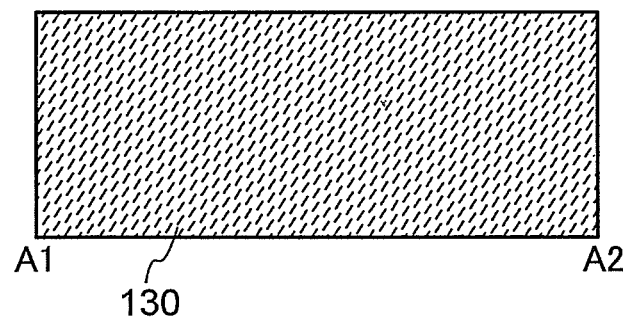
FIGS. 2A to 2C are cross-sectional views illustrating a manufacturing process of a semiconductor device according to one embodiment of the present invention.

First, the insulating layer 130 is formed over a substrate (not illustrated) (see FIG. 2A).

As the substrate containing a semiconductor material, a single crystal semiconductor substrate or a polycrystalline semiconductor substrate containing silicon, silicon carbide, or the like; a compound semiconductor substrate containing silicon germanium or the like; an SOI substrate; or the like can be used. A semiconductor element may be formed over the substrate. Alternatively, the substrate may be a glass substrate. Note that in general, the term "SOI substrate" means a substrate where a silicon semiconductor film is provided on an insulating surface. In this specification and the like, the term "SOI substrate" also includes a substrate where a semiconductor film formed using a material other than silicon is provided over an insulating surface in its category. That is, a semiconductor film included in the "SOI substrate" is not limited to a silicon semiconductor film. Further, the SOI substrate can be a substrate having a structure in which a semiconductor film is provided over an insulating substrate such as a glass substrate, with an insulating layer provided therebetween.

The insulating layer 130 can be formed using a silicon oxide film, a gallium oxide film, an aluminum oxide film, a silicon oxynitride film, an aluminum oxynitride film, or the like. The insulating layer 130 may contain excessive oxygen.

Figure 2B:
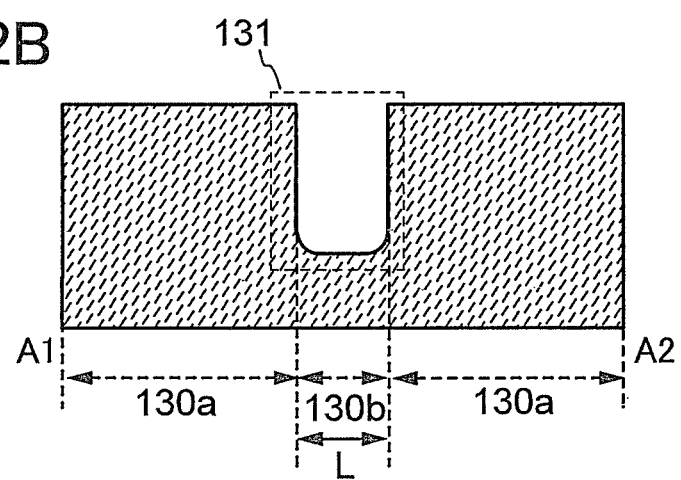

Next, the trench 131 (also referred to as a groove) is formed in the insulating layer 130 (see FIG. 2B). The trench 131 can be formed, for example, in such a manner that a resist mask is formed over the insulating layer 130 by a photolithography process and the insulating layer 130 is etched using the resist mask.

The trench 131 can be preferably formed by a dry etching method using a photolithography method and can be formed in a single etching step or through a plurality of etching steps. In the case of a plurality of etching steps, dry etching and wet etching may be used in combination.

For example, a dry etching method such as a reactive ion etching (RIE) method, an inductively coupled plasma (ICP) etching method, an electron cyclotron resonance (ECR) etching method, a parallel-plate (capacitively coupled) etching method, a magnetron plasma etching method, a dual-frequency plasma etching method, or a helicon wave plasma etching method can be used. A fluorocarbon-based gas such as trifluoromethane ($CHF_3$), carbon tetrafluoride ($CF_4$), or perfluorocyclobutane ($C_4F_8$); methane ($CH_4$); hydrogen; and a rare gas such as helium or argon can be appropriately mixed to be used as an etching gas.

Figure 2C:
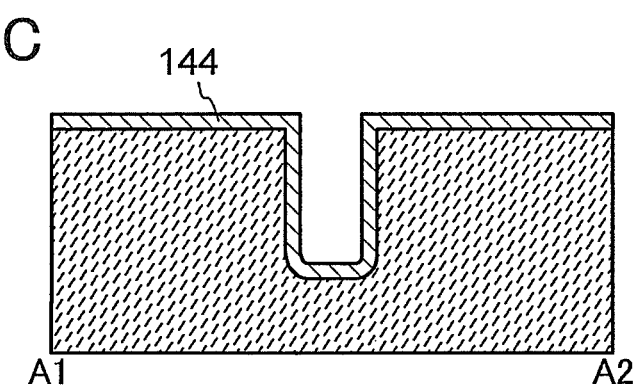

Then, the oxide semiconductor film 144 is formed so as to be in contact with the bottom surface and the side surface of the trench 131 and the top surface of the first region 130a (see FIG. 2C). Note that at least a region to be a channel formation region later of the oxide semiconductor film 144 is formed using a CAAC-OS film.

When a CAAC-OS film is used, a change in electric characteristics due to irradiation with visible light or ultraviolet light can be prevented. Thus, with the use of a CAAC-OS film, a transistor having stable electric characteristics and high reliability can be provided.

When the oxide semiconductor film 144 is formed to be a CAAC-OS film, the oxide semiconductor film 144 may be formed while the substrate is heated at a temperature higher than 200° C. and lower than or equal to 700° C., preferably higher than 300° C. and lower than or equal to 500° C., further preferably higher than or equal to 400° C. and lower than or equal to 450° C. When the substrate is heated at high temperatures during formation of the oxide semiconductor film, a CAAC-OS film in which the proportion of a crystalline portion is higher than the proportion of an amorphous portion can be formed.

Another method for forming the oxide semiconductor film 144 to be a CAAC-OS film is as follows: the substrate is heated during formation of the oxide semiconductor film at a temperature preferably lower than 200° C., further preferably lower than 180° C., so that the oxide semiconductor film 144 has an amorphous structure, and then, the amorphous oxide semiconductor film is subjected to heat treatment at a temperature higher than or equal to 350° C. and lower than or equal to 700° C., preferably higher than or equal to 400° C. and lower than or equal to 700° C., further preferably higher than or equal to 500° C. and lower than or equal to 700° C., still further preferably higher than or equal to 550° C. and lower than or equal to 700° C. to crystallize at least part of the amorphous oxide semiconductor film. In that manner, the oxide semiconductor film 144 including crystals with c-axis orientation can be formed. Note that the amorphous oxide semiconductor film can be subjected to heat treatment at any time before formation of the source region 144a, the drain region 144b, and the channel formation region 144c, which are formed later.

In the oxide semiconductor film 144, at least a region which is in contact with the bottom surface of the trench 131 and the side surface of the trench 131, which excludes the upper end corner portion 131a is a CAAC-OS film. The region is used as a channel formation region described later.

The oxide semiconductor film 144 can have a thickness greater than or equal to 1 nm and less than or equal to 100 nm and can be formed by a sputtering method, a molecular beam epitaxy (MBE) method, a pulse laser deposition method, an atomic layer deposition (ALD) method, or the like as appropriate. The oxide semiconductor film 144 may be formed using a sputtering apparatus which performs film formation with surfaces of a plurality of substrates set substantially perpendicular to a surface of a sputtering target, which is what is called a columnar plasma (CP) sputtering system. In this embodiment, the oxide semiconductor film 144 is processed into an island shape.

It is preferable that impurities such as hydrogen, water, a hydroxyl group, and hydride in a deposition chamber be removed by heating and evacuation of the deposition chamber before formation of the oxide semiconductor. It is particularly important to remove such impurities adsorbed on an inner wall of the deposition chamber. Here, the heat treatment may be performed at a temperature higher than or equal to 100° C. and lower than or equal to 450° C., for example. Evacuation of the deposition chamber is preferably performed with a rough vacuum pump such as a dry pump, and a high vacuum pump such as a sputter ion pump, a turbo molecular pump, or a cryopump, in appropriate combination. The turbo molecular pump has an outstanding capability in evacuating a large-sized molecule, whereas it has a low capability in evacuating hydrogen or water. Hence, combination of a cryopump having a high capability in evacuating water and a sputter ion pump having a high capability in evacuating hydrogen is effective. At this time, when the impurities are removed while an inert gas is introduced, the rate of desorption of water or the like, which is difficult to desorb only by evacuation, can be further increased. Removal of impurities in the deposition chamber by such treatment before the film formation of the oxide semiconductor can prevent hydrogen, water, a hydroxyl group, hydride, and the like from entering the oxide semiconductor film 144.

An oxide semiconductor to be used preferably contains at least indium (In) or zinc (Zn). In particular, In and Zn are preferably contained. As a stabilizer for reducing changes in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an In—Ga—Zn-based oxide means an oxide containing In, Ga, and Zn as its main component, and there is no limitation on the ratio of In:Ga:Zn. Further, the In—Ga—Zn-based oxide may contain a metal element other than In, Ga, and Zn.

Alternatively, a material represented by $InMO_3(ZnO)_m$ (m>0, m is not an integer) may be used as the oxide semiconductor. Note that M represents one or more metal elements selected from Ga, Fe, Mn, and Co. Alternatively, as the oxide semiconductor, a material represented by $In_3SnO_5(ZnO)_n$ (n>0, n is an integer) may be used.

For example, an In—Ga—Zn-based oxide with an atomic ratio of In:Ga:Zn=1:1:1 or In:Ga:Zn=2:2:1, or any of oxides whose composition is in the neighborhood of the above can be used. Alternatively, an In—Sn—Zn-based oxide with an atomic ratio of In:Sn:Zn=1:1:1, In:Sn:Zn=2:1:3, or In:Sn:Zn=2:1:5, or any of oxides whose composition is in the neighborhood of the above may be used.

However, the composition is not limited to those described above, and a material having an appropriate composition may be used depending on needed semiconductor characteristics (such as mobility, threshold voltage, and variation). In order to obtain needed semiconductor characteristics, it is preferable that the carrier concentration, the impurity concentration, the defect density, an atomic ratio of a metal element to oxygen, the interatomic distance, the density, and the like be set to appropriate values.

For example, it is relatively easy to obtain high mobility with an In—Sn—Zn-based oxide. However, mobility can be increased by reducing the defect density in a bulk also in the case of using an In—Ga—Zn-based oxide. In an oxide semiconductor having crystallinity, defects in the bulk can be further reduced and when a surface flatness is improved, mobility higher than that of an oxide semiconductor layer in an amorphous state can be obtained.

Note that for example, the expression "the composition of an oxide containing In, Ga, and Zn at an atomic ratio, In:Ga:Zn=a:b:c (a+b+c=1), is in the neighborhood of the composition of an oxide containing In, Ga, and Zn at an atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

In the case where an In—Ga—Zn-based oxide semiconductor material is used for the oxide semiconductor, a target having a composition ratio of $In_2O_3:Ga_2O_3:ZnO=1:x:y$ [molar ratio] (x is greater than or equal to 0, y is greater than or equal to 0.5 and less than or equal to 5) is preferably used. For example, a target having a composition ratio of $In_2O_3:Ga_2O_3:ZnO=1:1:2$ [molar ratio], or the like can be used. It is also possible to use a target with a composition ratio of $In_2O_3:Ga_2O_3:ZnO=1:1:1$ [molar ratio] or a target with a composition ratio of $In_2O_3:Ga_2O_3:ZnO=1:1:4$ [molar ratio].

In the case where an In—Sn—Zn-based oxide semiconductor material is used for the oxide semiconductor, an atomic ratio of metal elements in a target to be used may be In:Sn:Zn=1:2:2, In:Sn:Zn=2:1:3, In:Sn:Zn=1:1:1, In:Sn:Zn=20:45:35, or the like.

In the case where an In—Zn-based oxide semiconductor material is used for an oxide semiconductor, an atomic ratio of metal elements in a target to be used is In:Zn=50:1 to 1:2 ($In_2O_3:ZnO=25:1$ to 1:4 in a molar ratio), preferably, In:Zn=20:1 to 1:1 ($In_2O_3:ZnO=10:1$ to 1:2 in a molar ratio), further preferably, In:Zn=15:1 to 1.5:1 ($In_2O_3:ZnO=15:2$ to 3:4 in a molar ratio). For example, in a target used for formation of an In—Zn-based oxide semiconductor which has an atomic ratio of In:Zn:O=X:Y:Z, the relation of Z>1.5X+Y is satisfied.

Note that it is preferable that the oxide semiconductor film 144 be formed under a condition that much oxygen is contained during film formation (e.g., formed by a sputtering method in a 100% oxygen atmosphere), so that a film containing much oxygen (preferably including a region where the oxygen content is higher than that in the stoichiometric composition of the oxide semiconductor in a crystalline state) is formed.

Atmosphere of the film formation may be a rare gas (typically argon) atmosphere, an oxygen atmosphere, or a mixed atmosphere containing a rare gas and oxygen. Here, when the volume of oxygen is larger than the volume of a rare gas at the time of the film formation, supply of oxygen into the oxide semiconductor film 144 can be facilitated and an oxygen vacancy in the oxide semiconductor film 144 can be reduced. In order to prevent hydrogen, water, a hydroxyl group, hydride, and the like from entering the oxide semiconductor film 144, an atmosphere of a high-purity gas from which impurities such as hydrogen, water, a hydroxyl group, and hydride are sufficiently removed is preferable.

After the formation of the oxide semiconductor film 144, heat treatment may be performed on the oxide semiconductor film 144 in order to remove excess hydrogen (including water and a hydroxyl group) (to perform dehydration or dehydrogenation). The heat treatment can further remove hydrogen atoms or substances including hydrogen atoms in the oxide semiconductor film 144. The heat treatment is performed in an inert gas atmosphere at higher than or equal to 250° C. and lower than or equal to 700° C., preferably higher than or equal to 450° C. and lower than or equal to 600° C. or lower than a strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is higher than or equal to 6N (99.9999%), preferably higher than or equal to 7N (99.99999%) (that is, the concentration of the impurities is lower than or equal to 1 ppm, preferably lower than or equal to 0.1 ppm).

For example, after the substrate is introduced into an electric furnace including a resistance heater or the like, the heat treatment can be performed at 450° C. in a nitrogen atmosphere for one hour.

The heat treatment apparatus is not limited to the electric furnace and may be an apparatus for heating an object to be processed by thermal conduction or thermal radiation from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used. Note that in the case where a GRTA apparatus is used as the heat treatment apparatus, the substrate may be heated in an inert gas heated to a high temperature of 650° C. to 700° C. because the heat treatment time is short.

The above heat treatment has an advantageous effect of removing hydrogen, water, and the like and can be referred to as dehydration treatment, dehydrogenation treatment, or the like. The heat treatment can be performed at the timing, for example, after the oxide semiconductor film is processed to have an island shape. The number of times of such dehydration treatment or dehydrogenation treatment is not limited to one and may be two or more.

After the above heat treatment is performed on the oxide semiconductor film 144, heat treatment for supply of oxygen (supplying oxygen to an oxide semiconductor film; the same can be applied to the description hereinafter) may be performed in the same furnace. The heat treatment may be performed at a temperature higher than or equal to 200° C. and lower than the strain point of the substrate in a heat treatment apparatus to which a high-purity oxygen gas, a high-purity $N_2O$ gas, or ultra dry air (with a moisture content of 20 ppm (−55° C. by conversion into a dew point) or less, preferably 1 ppm or less, further preferably 10 ppb or less, in the case where measurement is performed with the use of a dew point meter of a cavity ring down laser spectroscopy (CRDS) system) is introduced. The heat treatment is performed preferably at a temperature higher than or equal to 250° C. and lower than or equal to 450° C. It is particularly preferable that water, hydrogen, and the like be not contained in these gases. The purity of the oxygen gas or the $N_2O$ gas that is introduced into the same furnace is preferably greater than or equal to 6N, further preferably greater than or equal to 7N (i.e., the impurity concentration is preferably less than or equal to 1 ppm, further preferably less than or equal to 0.1 ppm). By the action of the oxygen gas or the $N_2O$ gas, oxygen which is one of main components of the oxide semiconductor and which has been reduced through the steps for removing impurities by dehydration or dehydrogenation treatment can be supplied. Through this step, an oxygen vacancy generated by dehydration or dehydrogenation treatment can be compensated.

Note that the above heat treatment has an advantageous effect for compensating an oxygen vacancy generated in the oxide semiconductor by dehydration treatment or dehydrogenation treatment; thus, the heat treatment can also be referred to as oxygen supplying treatment or the like. The heat treatment can be performed at the timing, for example, after the oxide semiconductor film is processed into an island shape. Such oxygen supplying treatment may be performed once or plural times.

Next, through treatment for adding an impurity 141 to the upper end corner portion 131a where the top surface of the first region 130a intersects the side surface of the trench 131 and the oxide semiconductor film 144 in contact with the top surface of the first region 130a, the source region 144a and the drain region 144b are formed. At the same time, a region of the oxide semiconductor film 144, where the impurity 141 is not added (the oxide semiconductor film 144, which is formed to be a CAAC-OS film, in contact with the bottom surface of the trench 131 and the side surface of the trench 131 which excludes the upper end corner portion 131a), functions as the channel formation region 144c (see FIG. 3A).

As the impurity 141 to be added is phosphorus, boron, nitrogen, arsenic, argon, aluminum, a molecular ion containing any of the above element, or the like is used. As a method for adding the impurity 141 to the oxide semiconductor film 144 in contact with the upper end corner portion 131a and the top surface of the first region 130a, an ion doping method or an ion implantation method can be used. In this embodiment, the impurity 141 is added to the top surface of the first region 130a while the top surface of the first region 130a (surface of a substrate containing a semiconductor material) is inclined and rotated so that the impurity 141 is not added to the oxide semiconductor film 144 in contact with the bottom surface of the trench 131 and the side surface of the trench 131, which excludes the upper end corner portion 131a, which functions as a channel formation region.

When a normal direction of the surface of the substrate (top surface of the first region 130a) is a reference, an angle formed with a direction in which the impurity is emitted is θ (0°<θ<90°). When an acceleration voltage is set to $V_{ac}$ and a dose is set to $D_0$, the impurity 141 is added to the oxide semiconductor film 144 in contact with the top surface of the first region 130a in the direction perpendicular to the top surface of the first region 130a with an effective acceleration voltage of $V_{ac} \times \cos\theta$ and a dose of $D_0 \times \cos\theta$, and the impurity 141 is added to the oxide semiconductor film 144 in contact with the side surface of the trench 131 in the direction perpendicular to the side surface of the trench 131 with an effective acceleration voltage of $V_{ac} \times \sin\theta$ and a dose of $D_0 \times \sin\theta$. In the case where θ is small, the impurity can be added deeply to the side surface of the trench 131, as compared to the case where θ is large. However, since sing is small, the dose is decreased.

For example, when the impurity is added in the case where θ is 60°, an acceleration voltage is 40 kV, and a dose is $2 \times 10^{15}$ ions/cm², the impurity is added to the oxide semiconductor film 144 in contact with the top surface of the first region 130a in the direction perpendicular to the top surface of the first region 130a with an effective acceleration voltage of 20 kV and the dose $1 \times 10^{15}$ ions/cm², and the impurity is added to the oxide semiconductor film 144 in contact with the side surface of the trench 131 in the direction perpendicular to the side surface of the trench 131 with an effective acceleration voltage of 35 kV and the dose of $1.7 \times 10^{15}$ ions/cm².

The maximum value of θ is θ (0°<θ<90°) which satisfies the following Formula 3. A length of the trench 131 in a channel length direction and a thickness of the oxide semiconductor film are denoted by L and t, respectively.

[Formula 3]

$$\tan\theta = \frac{L - 2t}{t} \quad (3)$$

For example, when the length of the trench 131 in a channel length direction is 350 nm and the thickness of the oxide semiconductor film 144 is 20 nm, the maximum value of θ is approximately 84°.

Note that an "ion doping method" refers to a method by which an object is irradiated with an ionized gas that is generated from a source gas and accelerated by an electric field without mass separation and an element of the ionized gas is included in the object. An "ion implantation method", also referred to as an ion-implanted method, is a method in which a source gas is made into plasma, ion species included in this plasma are extracted and mass-separated, ion species with predetermined mass are accelerated, and an object is irradiated with the accelerated ion species as an ion beam.

The treatment for adding the impurity 141 to the oxide semiconductor film 144 may be performed plural times. In the case where the treatment for adding the impurity 141 to the oxide semiconductor film 144 is performed plural times, the kind of the impurity 141 may be the same in the plural treatments or different in every treatment.

The dose of the impurity 141 is preferably $1 \times 10^{14}$ ions/cm² to $2 \times 10^{16}$ ions/cm². When phosphorus is added as the impurity, the acceleration voltage is preferably 10 kV to 50 kV. In the case where the thickness of the oxide semiconductor film is further thinner, the acceleration voltage or the dose may be adjusted as appropriate. In this embodiment, phosphorus is added to the oxide semiconductor film 144 as the impurity 141 by an ion implantation method under the conditions where an acceleration voltage is 40 kV, a dose is $2 \times 10^{15}$ ions/cm², and θ is 60°.

Since the upper end corner portions 131a are sharp corner portions, in regions of the oxide semiconductor film 144, which are formed in contact with the upper end corner portions 131a where parts of the source region 144a and the drain region 144b are formed, a growth surface of a crystal having the c-axis which is substantially perpendicular to a surface of the oxide semiconductor film 144 might have low continuity. However, since the regions of the oxide semiconductor film 144, which are in contact with the upper end corner portions 131a, are used for the source region 144a and the drain region 144b and not used for the channel formation region as in this embodiment, a growth surface of a crystal having the c-axis which is substantially perpendicular to the surface of the oxide semiconductor film 144 are continuous in the whole channel formation region 144c. Thus, the transistor can have more stable electric characteristics.

The source region 144a and the drain region 144b have higher impurity concentrations than the channel formation region 144c. Since contact resistance is decreased as the impurity concentration is increased, excellent ohmic contact can be obtained between the oxide semiconductor film 144 and the source electrode layer 142a and the drain electrode layer 142b which are formed later.

A region where the impurity is added may be extended toward the bottom surface of the trench 131 from the upper end corner portion 131a to the oxide semiconductor film 144 in contact with the side surface of the trench 131, so that the source region 144a and the drain region 144b are extended toward the bottom surface of the trench 131 from the upper end corner portion 131a. The lengths of the source region 144a and the drain region 144b extended toward the bottom surface of the trench 131 may be different from each other.

Next, a conductive layer is formed over the source region 144a and the drain region 144b and is processed so that the source electrode layer 142a and the drain electrode layer 142b which are electrically connected to the source region 144a and the drain region 144b, respectively, are formed. An electrode, a wiring, or the like may be provided between the source region 144a and the source electrode layer 142a, and between the drain region 144b and the drain electrode layer 142b. The source electrode layer 142a and the drain electrode layer 142b may be formed below the source region 144a and the drain region 144b, respectively.

The source electrode layer 142a and the drain electrode layer 142b can be formed using a metal material such as molybdenum, titanium, tantalum, tungsten, aluminum, copper, chromium, neodymium, or scandium, or an alloy material which includes any of these materials as its main component.

Figure 3A:
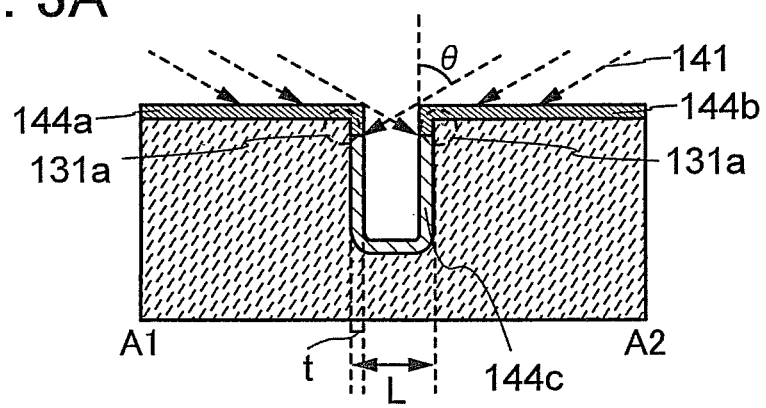
FIGS. 3A to 3C are cross-sectional views illustrating a manufacturing process of a semiconductor device according to one embodiment of the present invention.
Figure 3B:
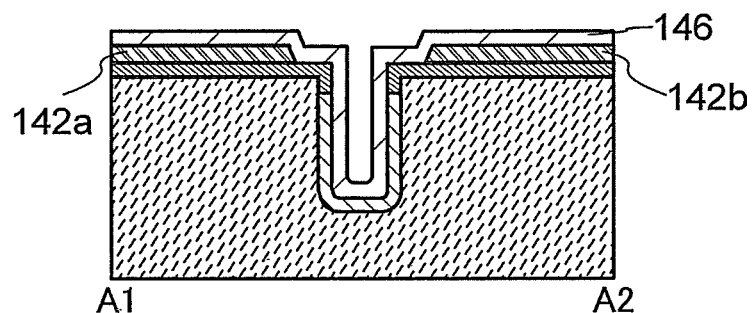

Then, the gate insulating layer 146 is formed over the oxide semiconductor film 144, the source electrode layer 142a, and the drain electrode layer 142b (see FIG. 3B).

The gate insulating layer 146 can have a thickness of 1 nm to 100 nm and can be formed by a sputtering method, an MBE method, a CVD method, a pulsed laser deposition method, an ALD method, or the like as appropriate. Note that in consideration of contact with the oxide semiconductor film 144, it is preferable that impurities such as hydrogen be sufficiently removed. Accordingly, it is preferable that the gate insulating layer 146 be formed by a sputtering method by which impurities such as hydrogen are less likely to enter the gate insulating layer 146.

The gate insulating layer 146 can be formed using a silicon oxide film, a gallium oxide film, an aluminum oxide film, a silicon nitride film, a silicon oxynitride film, an aluminum oxynitride film, a silicon nitride oxide film, or the like. Further, the gate insulating layer 146 is preferably formed in consideration of the size of a transistor to be formed and the step coverage with the gate insulating layer 146.

In this embodiment, a silicon oxide film of $SiO_{2+\alpha}$ ($\alpha>0$) is used as the gate insulating layer 146. By using the silicon oxide film as the gate insulating layer 146, oxygen can be supplied to the In—Ga—Zn-based oxide semiconductor and favorable characteristics can be obtained.

When the gate insulating layer 146 is formed using, for example, a high-k material such as hafnium oxide, yttrium oxide, lanthanum oxide, hafnium silicate ($HfSi_xO_y$ (x>0, y>0)), hafnium aluminate ($HfAl_xO_y$ (x>0, y>0)), hafnium silicate to which nitrogen is added, or hafnium aluminate to which nitrogen is added, gate leakage current can be reduced. Further, the gate insulating layer 146 may have a single-layer structure or a stacked-layer structure.

Heat treatment for supply of oxygen may be performed after the formation of the gate insulating layer 146. The heat treatment is preferably performed in an inert gas atmosphere or an oxygen atmosphere at a temperature higher than or equal to 200° C. and lower than or equal to 450° C., further preferably higher than or equal to 250° C. and lower than or equal to 350° C. By the heat treatment, variation in electric characteristics of the transistor can be reduced. In the case where the gate insulating layer 146 which is in contact with the oxide semiconductor film 144 includes oxygen, oxygen can be supplied to the oxide semiconductor film 144 to fill an oxygen vacancy in the oxide semiconductor film 144.

By the heat treatment for dehydration or dehydrogenation and the heat treatment for supply of oxygen, an i-type (intrinsic) or substantially i-type oxide semiconductor film can be formed.

The same as the gate insulating layer 146 can be applied to the insulating layer 130 in contact with the oxide semiconductor film 144.

Note that in this embodiment, the heat treatment for supply of oxygen is performed after the formation of the gate insulating layer 146; however, the timing of the heat treatment is not limited thereto. For example, the heat treatment may be performed after the formation of the source electrode layer 142a and the drain electrode layer 142b. The heat treatment for supply of oxygen may also serve as the heat treatment for dehydration or dehydrogenation.

Figure 3C:
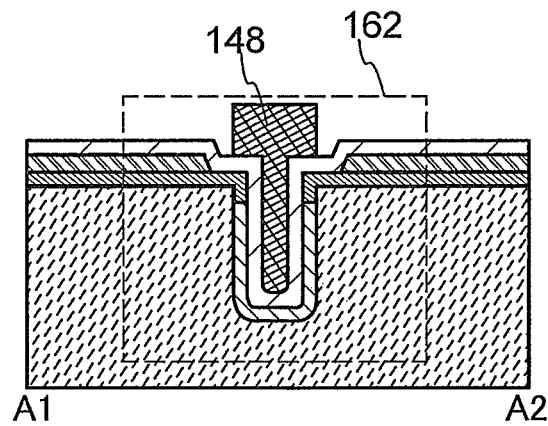

Next, the gate electrode layer 148 is formed over the oxide semiconductor film 144 with the gate insulating layer 146 provided therebetween (see FIG. 3C). In this embodiment, the gate electrode layer 148 is provided so as to overlap with parts of the source region 144a and the drain region 144b and to fill the trench 131.

The gate electrode layer 148 can be formed using a metal material such as molybdenum, titanium, tantalum, tungsten, aluminum, copper, chromium, neodymium, or scandium or an alloy material which contains any of these materials as its main component. As the gate electrode layer 148, a semiconductor film typified by a polycrystalline silicon film to which an impurity element such as phosphorus is added, or a silicide film such as a nickel silicide film may be used. The gate electrode layer 148 may have a single-layer structure or a stacked-layer structure.

As one layer of the gate electrode layer 148 which is in contact with the gate insulating layer 146, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film is preferably used. These films each have a work function higher than or equal to 5 eV, preferably higher than or equal to 5.5 eV, which enables the threshold voltage which is one of the electric characteristics of the transistor to be positive when used as the gate electrode layer 148. Accordingly, what is called a normally-off switching element can be provided.

Figure 4:
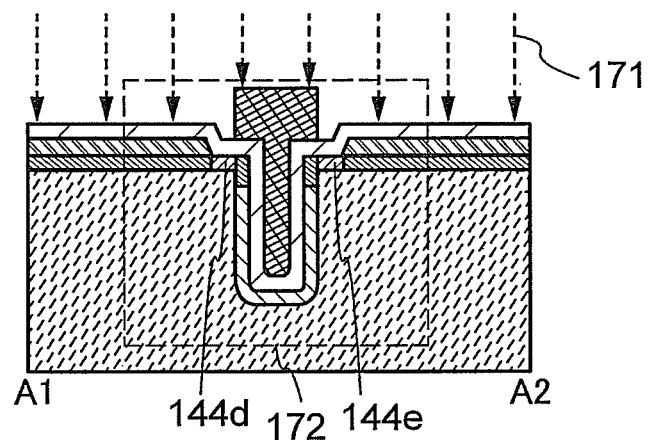
FIG. 4 is a cross-sectional view illustrating a manufacturing process of a semiconductor device according to one embodiment of the present invention.

After the gate electrode layer 148 is formed, an impurity 171 may be further added to the oxide semiconductor film 144 and a transistor 172 may be manufactured (see FIG. 4). As the impurity 171 to be added, an impurity similar to the impurity 141 can be used. Accordingly, in a region of the oxide semiconductor film 144, which does not overlap with any of the source electrode layer 142a, the drain electrode layer 142b, and the gate electrode layer 148, a region 144d and a region 144e having higher impurity concentrations than the source region 144a and the drain region 144b can be formed. As described above, when the impurity concentrations of the region 144d and the region 144e are increased, the parasitic resistance of the transistor 172 can be reduced; thus, the on-state current and the mobility of the transistor 172 can be increased.

In this manner, the transistor 162 and the transistor 172 in this embodiment can be manufactured. In each of the transistor 162 and the transistor 172 in this embodiment, the oxide semiconductor film 144 is provided in contact with the bottom surface and the side surface of the trench 131, whereby the effective channel lengths of the transistor 162 and the transistor 172 can be longer than the distance between the source electrode 142a and the drain electrode 142b (apparent channel lengths of the transistor 162 and the transistor 172). For example, in each of the transistor 162 and the transistor 172, when the oxide semiconductor film 144 is formed in contact with the side surface and the bottom surface of the trench 131, the channel length can be twice or more as large as the length of the bottom surface of the trench 131 (the length of the second region 130b in the channel length direction). Accordingly, a short-channel effect can be suppressed and miniaturization of the transistor can be achieved.

In the transistor 162 and the transistor 172 described in this embodiment, since the upper end corner portions 131a are sharp corner portions, in regions of the oxide semiconductor film 144, which are formed in contact with the upper end corner portions 131a where parts of the source region 144a and the drain region 144b are formed, a growth surface of a crystal having the c-axis which is substantially perpendicular to a surface of the oxide semiconductor film 144 might have low continuity. However, since the regions of the oxide semiconductor film 144, which are in contact with the upper end corner portions 131a, are used for the source region 144a and the drain region 144b and not used for the channel formation region, a growth surface of a crystal having the c-axis which is substantially perpendicular to the surface of the oxide semiconductor film 144 are continuous in the whole channel formation region 144c. Thus, the transistor can have more stable electric characteristics.

The source region 144a and the drain region 144b have higher impurity concentrations than the channel formation region 144c. Since contact resistance is decreased as the impurity concentration is increased, excellent ohmic contact can be obtained between the oxide semiconductor film 144 and the source electrode layer 142a and the drain electrode layer 142b.

The structures, methods, and the like described in this embodiment can be combined as appropriate with any of the structures, methods, and the like described in the other embodiments.

Embodiment 2

In this embodiment, another method for manufacturing the transistor 162 described in the above embodiment will be described with reference to FIGS. 2A to 2C and FIGS. 5A to 5C.

First, the insulating layer 130 is formed over a substrate (not illustrated) containing a semiconductor material (see FIG. 2A).

Next, the trench 131 is formed in the insulating layer 130 (see FIG. 2B).

Figure 5A:
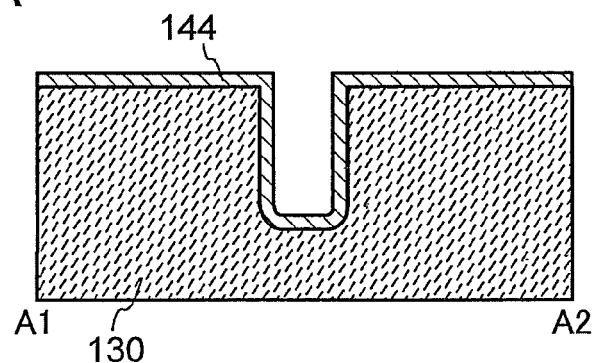
FIGS. 5A to 5C are cross-sectional views illustrating a manufacturing process of a semiconductor device according to one embodiment of the present invention.

Then, the oxide semiconductor film 144 is formed so as to be in contact with the bottom surface and the side surface of the trench 131 and the top surface of the first region 130a (see FIG. 5A).

The above embodiment can be referred to for the formation methods, materials, and the like of the insulating layer 130, the trench 131, and the oxide semiconductor film 144.

Figure 5B:
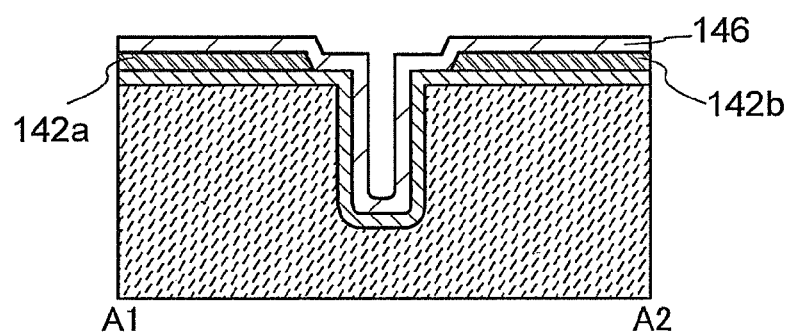

Next, a conductive layer is formed over the oxide semiconductor film 144 and is processed so that the source electrode 142a and the drain electrode 142b are formed (see FIG. 5B).

The above embodiment can be referred to for the formation method, material, and the like of the source electrode layer 142a and the drain electrode layer 142b.

Then, the gate insulating layer 146 is formed over the oxide semiconductor film 144, the source electrode layer 142a, and the drain electrode layer 142b (see FIG. 5B).

The above embodiment can be referred to for the formation method, material, and the like of the gate insulating layer 146.

In this embodiment, a silicon oxide film of $SiO_{2+\alpha}$ ($\alpha>0$) having a thickness of 20 nm is used as the gate insulating layer 146.

Figure 5C:
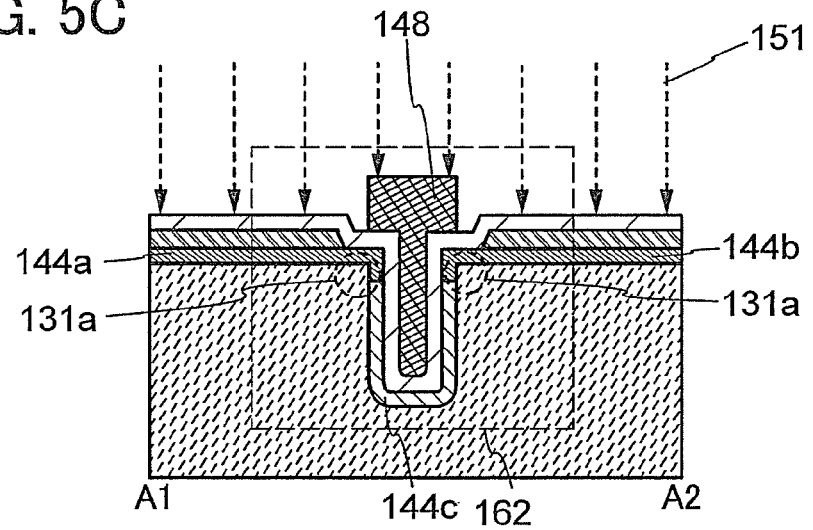

Next, the gate electrode layer 148 is formed over the oxide semiconductor film 144 with the gate insulating layer 146 provided therebetween (see FIG. 5C).

The above embodiment can be referred to for the formation method, material, and the like of the gate electrode layer 148.

In this embodiment, tantalum nitride is used for the gate electrode layer 148. The gate electrode layer 148 fills the trench 131. Further, the gate electrode layer 148 having a thickness of 100 nm is stacked over the filled trench 131 and the gate insulating layer 146 in contact with the upper end corner portion 131a.

Next, through treatment for adding an impurity 151 at least to the upper end corner portion 131a where the top surface of the first region 130a intersects the side surface of the trench 131 and the oxide semiconductor film 144 in contact with the top surface of the first region 130a, the source region 144a and the drain region 144b are formed. Note that an impurity ion is added to the oxide semiconductor film 144 which overlaps with the gate electrode layer 148 through the gate electrode layer 148. At the same time, a region of the oxide semiconductor film 144, where the impurity 151 is not added (the oxide semiconductor film 144, which is formed to be a CAAC-OS film, in contact with the bottom surface of the trench 131 and the side surface of the trench 131, which excludes the upper end corner portion 131a), functions as the channel formation region 144c.

As the impurity 151 to be added is phosphorus, boron, nitrogen, arsenic, argon, aluminum, a molecular ion containing any of the above element, or the like is used. As a method for adding the impurity 151 to the oxide semiconductor film 144 in contact with the upper end corner portion 131a and the top surface of the first region 130a, an ion doping method or an ion implantation method can be used.

The treatment for adding the impurity 151 to the oxide semiconductor film 144 may be performed plural times. In the case where the treatment for adding the impurity 151 to the oxide semiconductor film 144 is performed plural times, the kind of the impurity 151 may be the same in the plural treatments or different in every treatment.

The dose of the impurity 151 is preferably $1\times10^{14}$ ions/cm$^2$ to $2\times10^{16}$ ions/cm$^2$. When phosphorus is added as the impurity, the acceleration voltage is preferably 180 kV to 200 kV. When boron is added as the impurity, the acceleration voltage is preferably 60 kV to 70 kV. In this embodiment, phosphorus is added to the oxide semiconductor film 144 as the impurity 151 by an ion implantation method under the conditions where the acceleration voltage is 190 kV, a dose is $5\times10^{15}$ ions/cm$^2$, and an angle θ is 0°, which is formed with a direction in which the impurity is emitted when a normal direction of the surface of the substrate (top surface of the first region 130a) described in the above embodiment is a reference.

Since the upper end corner portions 131a are sharp corner portions, in regions of the oxide semiconductor film 144, which are formed in contact with the upper end corner portions 131a where parts of the source region 144a and the drain region 144b are formed, a growth surface of a crystal having the c-axis which is substantially perpendicular to a surface of the oxide semiconductor film 144 might have low continuity. However, since the regions of the oxide semiconductor film 144, which are in contact with the upper end corner portions 131a, are used for the source region 144a and the drain region 144b and not used for the channel formation region as in this embodiment, a growth surface of a crystal having the c-axis which is substantially perpendicular to the surface of the oxide semiconductor film 144 are continuous in the whole channel formation region 144c. Thus, the transistor can have more stable electric characteristics.

The source region 144a and the drain region 144b have higher impurity concentrations than the channel formation region 144c. Since contact resistance is decreased as the impurity concentration is increased, excellent ohmic contact can be obtained between the oxide semiconductor film 144 and the source electrode layer 142a and the drain electrode layer 142b.

A region where the impurity is added may be extended toward the bottom surface of the trench 131 from the upper end corner portion 131a to the oxide semiconductor film 144 in contact with the side surface of the trench 131, so that the source region 144a and the drain region 144b are extended toward the bottom surface of the trench 131 from the upper end corner portion 131a. The lengths of the source region 144a and the drain region 144b extended toward the bottom surface of the trench 131 may be different from each other.

As illustrated in FIG. 4 described in the above embodiment, the transistor 172 in which a region 144d and a region 144e having higher impurity concentrations than the source region 144a and the drain region 144b is formed in a region of the oxide semiconductor film 144, which does not overlap with any of the source electrode layer 142a, the drain electrode layer 142b, and the gate electrode layer 148 may be manufactured. As described above, when the impurity concentrations of the region 144d and the region 144e are increased, the parasitic resistance of the transistor 172 can be reduced; thus, the on-state current and the mobility of the transistor 172 can be increased.

In this manner, the transistor 162 and the transistor 172 in this embodiment can be manufactured. In each of the transistor 162 and the transistor 172 in this embodiment, the oxide semiconductor film 144 is provided in contact with the bottom surface and the side surface of the trench 131, whereby the effective channel lengths of the transistor 162 and the transistor 172 can be longer than the distance between the source electrode 142a and the drain electrode 142b (apparent channel lengths of the transistor 162 and the transistor 172). For example, in each of the transistor 162 and the transistor 172, when the oxide semiconductor film 144 is formed in contact with the side surface and the bottom surface of the trench 131, the channel length can be twice or more as large as the length of the bottom surface of the trench 131 (the length of the second region 130b in the channel length direction). Accordingly, a short-channel effect can be suppressed and miniaturization of the transistor can be achieved.

In the transistor 162 and the transistor 172 described in this embodiment, since the upper end corner portions 131a are sharp corner portions, in regions of the oxide semiconductor film 144, which are formed in contact with the upper end corner portions 131a where parts of the source region 144a and the drain region 144b are formed, a growth surface of a crystal having the c-axis which is substantially perpendicular to a surface of the oxide semiconductor film 144 might have low continuity. However, when the regions of the oxide semiconductor film 144, which are in contact with the upper end corner portions 131a, are used for the source region 144a and the drain region 144b, a growth surface of a crystal having the c-axis which is substantially perpendicular to the surface of the oxide semiconductor film 144 are continuous in the whole channel formation region 144c. Thus, the transistor can have more stable electric characteristics.

The source region 144a and the drain region 144b have higher impurity concentrations than the channel formation region 144c. Since contact resistance is decreased as the impurity concentration is increased, excellent ohmic contact can be obtained between the oxide semiconductor film 144 and the source electrode layer 142a and the drain electrode layer 142b.

The structures, methods, and the like described in this embodiment can be combined as appropriate with any of the structures, methods, and the like described in the other embodiments.

Embodiment 3

In this embodiment, another method for manufacturing the transistor 162 described in the above embodiment will be described with reference to FIGS. 2A to 2C and FIGS. 6A to 6D.

First, the insulating layer 130 is formed over a substrate (not illustrated) containing a semiconductor material (see FIG. 2A).

Next, the trench 131 is formed in the insulating layer 130 (see FIG. 2B).

Figure 6A:
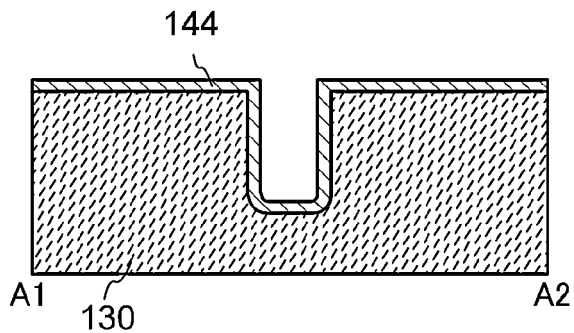
FIGS. 6A to 6D are cross-sectional views illustrating a manufacturing process of a semiconductor device according to one embodiment of the present invention.
Figure 6B:
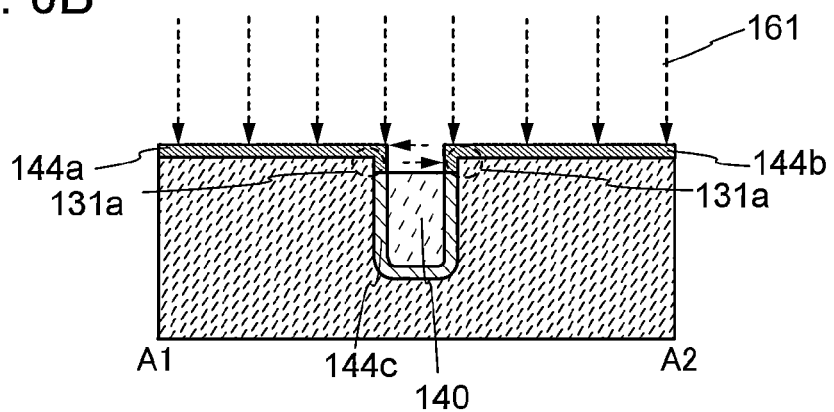

Then, the oxide semiconductor film 144 is formed so as to be in contact with the bottom surface and the side surface of the trench 131 and the top surface of the first region 130a (see FIG. 6A).

The above embodiment can be referred to for the formation methods, materials, and the like of the insulating layer 130, the trench 131, and the oxide semiconductor film 144.

Next, a resist mask 140 which covers the bottom surface of the trench 131 and the side surface of the trench 131, which excludes the upper end corner portion 131a, is formed in contact with and over the oxide semiconductor film 144 and then through treatment for adding an impurity 161 at least to the upper end corner portion 131a where the top surface of the first region 130a intersects the side surface of the trench 131 and the oxide semiconductor film 144 in contact with the top surface of the first region 130a, the source region 144a and the drain region 144b are formed. At the same time, a region of the oxide semiconductor film 144, where the impurity 161 is not added (the oxide semiconductor film 144, which is formed to be a CAAC-OS film, in contact with the side surface of the trench 131, which excludes the upper end corner portion 131a, and the bottom surface of the trench 131), functions as the channel formation region 144c (see FIG. 6B).

As the impurity 161 to be added is phosphorus, boron, nitrogen, arsenic, argon, aluminum, a molecular ion containing any of the above element, or the like is used. As a method for adding the impurity 161 to the oxide semiconductor film 144 in contact with the upper end corner portion 131a and the top surface of the first region 130a, a plasma immersion ion implantation (PIII) method or a plasma based ion implantation (PBII) method can be used.

Note that the above "PIII method" and "PBII method" are plasma-based three-dimensional ion implantation methods. In the methods, a sample is put in plasma and a voltage is applied to the sample and then ions accelerated with the voltage are injected to the sample. With the above methods, ions are injected evenly to a sample from three-dimensional directions even when the sample has an uneven surface.

The treatment for adding the impurity 161 to the oxide semiconductor film 144 may be performed plural times. In the case where the treatment for adding the impurity 161 to the oxide semiconductor film 144 is performed plural times, the kind of the impurity 161 may be the same in the plural treatments or different in every treatment.

The dose of the impurity 161 is preferably $1 \times 10^{14}$ ions/cm$^2$ to $2 \times 10^{16}$ ions/cm$^2$. When phosphorus is added as the impurity, the acceleration voltage is preferably 10 kV to 50 kV. In the case where the thickness of the oxide semiconductor film is further thinner, the acceleration voltage or the dose may be adjusted as appropriate. In this embodiment, phosphorus is added to the oxide semiconductor film 144 as the impurity 161 by a PIII method under the conditions where the acceleration voltage is 20 kV, and the dose is $1\times10^{15}$ ions/cm$^2$.

Since the upper end corner portions 131a are sharp corner portions, in regions of the oxide semiconductor film 144, which are formed in contact with the upper end corner portions 131a where parts of the source region 144a and the drain region 144b are formed, a growth surface of a crystal having the c-axis which is substantially perpendicular to a surface of the oxide semiconductor film 144 might have low continuity. However, since the regions of the oxide semiconductor film 144, which are in contact with the upper end corner portions 131a, are used for the source region 144a and the drain region 144b and not used for the channel formation region as in this embodiment, a growth surface of a crystal having the c-axis which is substantially perpendicular to the surface of the oxide semiconductor film 144 are continuous in the whole channel formation region 144c. Thus, the transistor can have more stable electric characteristics.

The source region 144a and the drain region 144b have higher impurity concentrations than the channel formation region 144c. Since contact resistance is decreased as the impurity concentration is increased, excellent ohmic contact can be obtained between the oxide semiconductor film 144 and the source electrode layer 142a and the drain electrode layer 142b which are formed later.

A region where the impurity is added may be extended toward the bottom surface of the trench 131 from the upper end corner portion 131a to the oxide semiconductor film 144 in contact with the side surface of the trench 131, so that the source region 144a and the drain region 144b are extended toward the bottom surface of the trench 131 from the upper end corner portion 131a. The lengths of the source region 144a and the drain region 144b extended toward the bottom surface of the trench 131 may be different from each other.

Figure 6C:
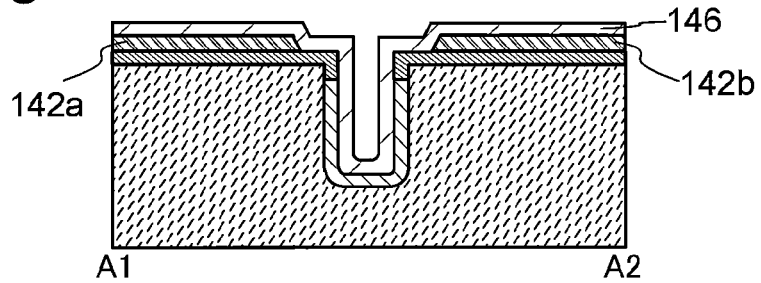

Next, the resist mask 140 is removed, a conductive layer is formed over the source region 144a and the drain region 144b, and the conductive layer is processed so that the source electrode layer 142a and the drain electrode layer 142b which are electrically connected to the source region 144a and the drain region 144b, respectively, are formed (see FIG. 6C). An electrode, a wiring, or the like may be provided between the source region 144a and the source electrode layer 142a, and between the drain region 144b and the drain electrode layer 142b.

The above embodiment can be referred to for the formation method, material, and the like of the source electrode layer 142a and the drain electrode layer 142b.

Then, the gate insulating layer 146 is formed over the oxide semiconductor film 144, the source electrode layer 142a, and the drain electrode layer 142b.

The above embodiment can be referred to for the formation method, material, and the like of the gate insulating layer 146.

Figure 6D:
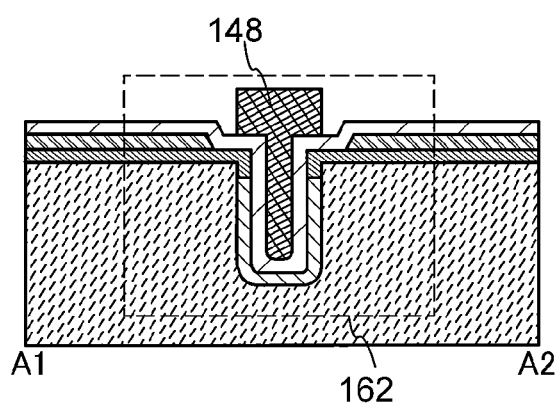

Next, the gate electrode layer 148 is formed over the oxide semiconductor film 144 with the gate insulating layer 146 provided therebetween (see FIG. 6D). In this embodiment, the gate electrode layer 148 is provided so as to overlap with parts of the source region 144a and the drain region 144b and to fill the trench 131.

The above embodiment can be referred to for the formation method, material, and the like of the gate electrode layer 148.

As illustrated in FIG. 4 described in the above embodiment, after the gate electrode layer 148 is formed, an impurity 171 may be further added to the oxide semiconductor film 144 and a transistor 172 may be manufactured. As the impurity 171 to be added, an impurity similar to the impurity 161 can be used. Accordingly, in a region of the oxide semiconductor film 144, which does not overlap with any of the source electrode layer 142a, the drain electrode layer 142b, and the gate electrode layer 148, a region 144d and a region 144e having higher impurity concentrations than the source region 144a and the drain region 144b can be formed. As described above, when the impurity concentrations of the region 144d and the region 144e are increased, the parasitic resistance of the transistor 172 can be reduced; thus, the on-state current and the mobility of the transistor 172 can be increased.

In this manner, the transistor 162 and the transistor 172 in this embodiment can be manufactured. In each of the transistor 162 and the transistor 172 in this embodiment, the oxide semiconductor film 144 is provided in contact with the bottom surface and the side surface of the trench 131, whereby the effective channel lengths of the transistor 162 and the transistor 172 can be longer than the distance between the source electrode 142a and the drain electrode 142b (apparent channel lengths of the transistor 162 and the transistor 172). For example, in the transistor 162, when the oxide semiconductor film 144 is formed in contact with the side surface and the bottom surface of the trench 131, the channel length can be twice or more as large as the length of the bottom surface of the trench 131 (the length of the second region 130b in the channel length direction). Accordingly, a short-channel effect can be suppressed and miniaturization of the transistor can be achieved.

In the transistor 162 and the transistor 172 described in this embodiment, since the upper end corner portions 131a are sharp corner portions, in regions of the oxide semiconductor film 144, which are formed in contact with the upper end corner portions 131a where parts of the source region 144a and the drain region 144b are formed, a growth surface of a crystal having the c-axis which is substantially perpendicular to a surface of the oxide semiconductor film 144 might have low continuity. However, since the regions of the oxide semiconductor film 144, which are in contact with the upper end corner portions 131a, are used for the source region 144a and the drain region 144b and not used for the channel formation region, a growth surface of a crystal having the c-axis which is substantially perpendicular to the surface of the oxide semiconductor film 144 are continuous in the whole channel formation region 144c. Thus, the transistor can have more stable electric characteristics.

The source region 144a and the drain region 144b have higher impurity concentrations than the channel formation region 144c. Since contact resistance is decreased as the impurity concentration is increased, excellent ohmic contact can be obtained between the oxide semiconductor film 144 and the source electrode layer 142a and the drain electrode layer 142b.

The structures, methods, and the like described in this embodiment can be combined as appropriate with any of the structures, methods, and the like described in the other embodiments.

Embodiment 4

In this embodiment, an example of a semiconductor device which includes the transistor 162 described in Embodiment 1, which can hold stored data even when not powered, and which does not have a limitation on the number of write cycles, will be described with reference to FIGS. 7A to 7C.

Since the off-state current of the transistor 162 including an oxide semiconductor is smaller than that of a transistor formed using a semiconductor material other than an oxide semiconductor (e.g., silicon), stored data can be held for a long time owing to such a transistor. In other words, power consumption can be sufficiently reduced because a semiconductor memory device in which refresh operation is unnecessary or the frequency of refresh operation is extremely low can be provided.

Figure 7A:
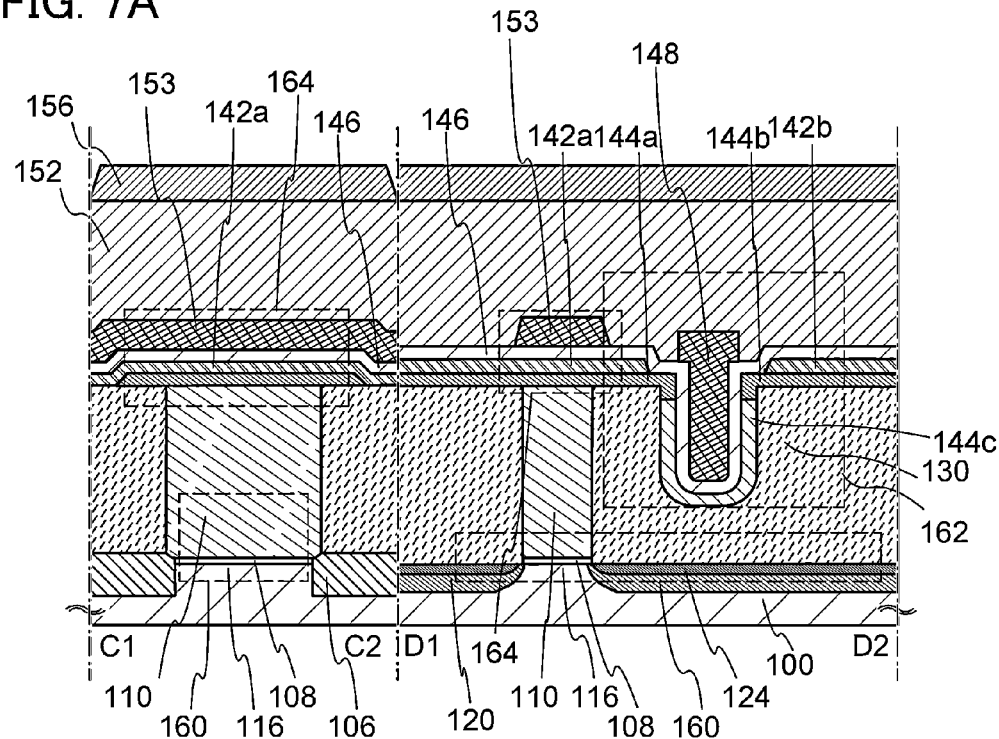
FIGS. 7A to 7C are a cross-sectional view, a plan view, and a circuit diagram illustrating a semiconductor device according to one embodiment of the present invention.
Figure 7B:
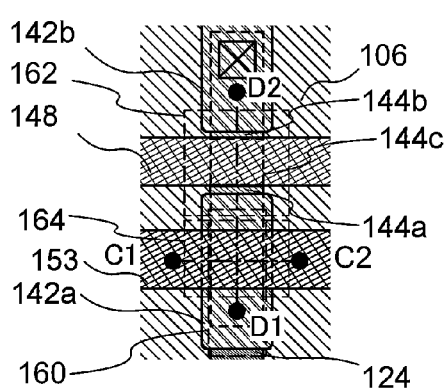
Figure 7C:
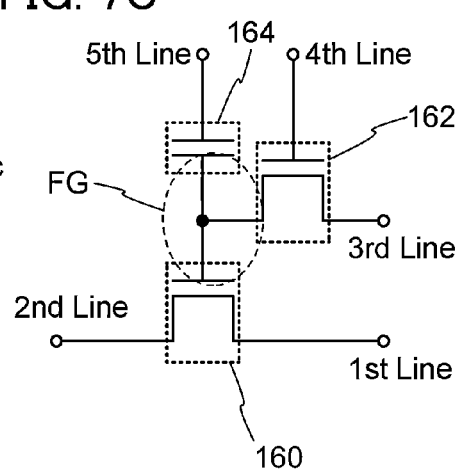

FIGS. 7A to 7C illustrate one example of a structure of the semiconductor device. FIGS. 7A to 7C illustrate a cross-sectional view, a plan view, and a circuit diagram, respectively, of the semiconductor device. Here, FIG. 7A corresponds to a cross section taken along line C1-C2 and line D1-D2 in FIG. 7B.

The semiconductor device illustrated in FIGS. 7A and 7B includes a transistor 160 including a first semiconductor material in a lower portion, and a transistor 162 including a second semiconductor material in an upper portion. Note that the structure of the transistor 162 is the same as that described in Embodiment 1; thus, for description of FIGS. 7A and 7B, the same reference numerals are used for the same parts as those in FIGS. 1A and 1B.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor can hold charge for a long time owing to its characteristics.

Although all the transistors are n-channel transistors here, it is needless to say that p-channel transistors can be used. The technical nature of the disclosed invention is to use the transistor 162 in which the source region and the drain region are included in the oxide semiconductor film in contact with the upper end corner portion of the trench so that data can be held. Thus, it is not necessary to limit a specific structure of the semiconductor device, such as a material of the semiconductor device or a structure of the semiconductor device, to those described here.

The transistor 160 in FIG. 7A includes a channel formation region 116 provided in a substrate 100 including a semiconductor material (e.g., silicon), impurity regions 120 provided such that the channel formation region 116 is provided therebetween, metal compound regions 124 in contact with the impurity regions 120, an insulating layer 108 provided over the channel formation region 116, and a gate electrode layer 110 provided over the insulating layer 108.

Although not illustrated in FIG. 7A, an electrode may be connected to part of the metal compound region 124 of the transistor 160. Here, the electrode functions as a source electrode layer or a drain electrode layer of the transistor 160. Further, an element isolation insulating layer 106 is formed over the substrate 100 so as to surround the transistor 160, and the insulating layer 130 is formed to cover the transistor 160. Note that in order to achieve high integration, the transistor 160 preferably has a structure without a sidewall insulating layer as illustrated in FIG. 7A. On the other hand, when the characteristics of the transistor 160 have priority, the sidewall insulating layer may be formed on a side surface of the gate electrode layer 110 and the impurity regions 120 may include a region having a different impurity concentration.

As illustrated in FIG. 7A, the transistor 162 includes the source region and the drain region of the oxide semiconductor film in contact with the upper end corner portion of the trench. Here, the oxide semiconductor film 144 is preferably highly purified by dehydration treatment or dehydrogenation treatment.

Treatment for adding an impurity is performed on the oxide semiconductor film 144, so that the source region 144a, the drain region 144b and the channel formation region 144c are provided.

A conductive layer 153 is provided in a region overlapping with the source electrode layer 142a of the transistor 162 with the gate insulating layer 146 interposed therebetween; a capacitor 164 includes the source electrode layer 142a, the gate insulating layer 146, and the conductive layer 153. That is, the source electrode layer 142a of the transistor 162 functions as one electrode of the capacitor 164, and the conductive layer 153 functions as the other electrode of the capacitor 164. The conductive layer 153 can be manufactured through the same steps as the gate electrode layer 148. Note that the capacitor 164 may be omitted if a capacitor is not needed. Further, the capacitor 164 may be separately provided above the transistor 162. For example, a trench-type capacitor or a stack-type capacitor may be separately formed above the transistor 162 or below the transistor 160 so as to be three-dimensionally stacked, whereby the degree of integration may be further increased.

An insulating layer 152 is provided over the transistor 162 and the capacitor 164. Further, a wiring 156 for connecting the transistor 162 to another transistor is provided over the insulating layer 152. Note that although not illustrated in FIG. 7A, the wiring 156 may be electrically connected to the drain electrode 142b through an electrode formed in an opening which is formed in the gate insulating layer 146, the insulating layer 152, and the like. Here, the electrode is preferably provided so as to overlap with at least part of the oxide semiconductor film 144 of the transistor 162.

In FIGS. 7A and 7B, the transistor 160 and the transistor 162 are provided so as to overlap with each other at least partly. The source region or the drain region of the transistor 160 is preferably provided so as to overlap with part of the oxide semiconductor film 144. Further, the transistor 162 and the capacitor 164 are provided so as to overlap with at least part of the transistor 160. With such a planar layout, the area occupied by the semiconductor device can be reduced; thus, high integration can be achieved.

In order to connect the metal compound region 124 and the drain electrode layer 142b, for example, the drain electrode layer 142b may be in direct contact with the metal compound region 124. Alternatively, the wiring 156 may be in direct contact with the drain electrode layer 142b.

Next, an example of a circuit configuration corresponding to FIGS. 7A and 7B is illustrated in FIG. 7C.

In FIG. 7C, a first wiring (a 1st Line) is electrically connected to a source electrode layer of the transistor 160. A second wiring (2nd Line) is electrically connected to a drain electrode layer of the transistor 160. A third wiring (3rd Line) is electrically connected to one of the source electrode layer and the drain electrode layer of the transistor 162, and a fourth wiring (4th Line) is electrically connected to a gate electrode layer of the transistor 162. The gate electrode layer of the transistor 160 and the other of the source electrode layer and the drain electrode layer of the transistor 162 are electrically connected to one electrode of the capacitor 164, and a fifth wiring (5th line) is electrically connected to the other electrode of the capacitor 164.

The semiconductor device in FIG. 7C utilizes a characteristic in which the potential of the gate electrode layer of the transistor 160 can be held, and can thus write, hold, and read data as follows.

Writing and holding of data will be described. First, the potential of the fourth wiring is set to a potential at which the transistor 162 is turned on, so that the transistor 162 is turned on. Accordingly, the potential of the third wiring is supplied to the gate electrode layer of the transistor 160 and the capacitor 164. That is, predetermined charge is given to the gate electrode layer of the transistor 160 (writing of data). Here, one of two kinds of charges providing different potentials (hereinafter referred to as a low-level charge and a high-level charge) is applied. After that, the potential of the fourth wiring is set to a potential at which the transistor 162 is turned off, so that the transistor 162 is turned off. Thus, the charge given to the gate electrode layer of the transistor 160 is held (holding of data).

Since the off-state current of the transistor 162 is extremely small, the charge of the gate electrode layer of the transistor 160 is held for a long time.

Next, reading of data will be described. By supplying an appropriate potential (reading potential) to the fifth wiring while a predetermined potential (constant potential) is supplied to the first wiring, the potential of the second wiring varies depending on the amount of charge held in the gate electrode layer of the transistor 160. This is because in general, when the transistor 160 is an n-channel transistor, an apparent threshold voltage $V_{th\_H}$ in the case where a high-level charge is given to the gate electrode layer of the transistor 160 is lower than an apparent threshold voltage $V_{th\_L}$ in the case where a low-level charge is given to the gate electrode layer of the transistor 160. Here, an apparent threshold voltage refers to the potential of the fifth wiring, which is needed to turn on the transistor 160. Thus, the potential of the fifth wiring is set to a potential $V_0$ which is between $V_{th\_H}$ and $V_{th\_L}$, whereby charge given to the gate electrode layer of the transistor 160 can be determined. For example, in the case where a high-level charge is given in writing, when the potential of the fifth wiring is set to $V_0$ ($>V_{th\_H}$), the transistor 160 is turned on. In the case where a low-level charge is given in writing, even when the potential of the fifth wiring is set to $V_0$ ($<V_{th\_L}$), the transistor 160 remains in an off state. Therefore, the data held can be read by measuring the potential of the second wiring.

Note that in the case where memory cells are arrayed to be used, data of only desired memory cells needs to be read. In the case where such reading is not performed, a potential at which the transistor 160 is turned off regardless of the state of the gate electrode layer of the transistor 160, that is, a potential smaller than $V_{th\_H}$ may be given to the fifth wiring. Alternatively, a potential at which the transistor 160 is turned on regardless of the state of the gate electrode layer, that is, a potential higher than $V_{th\_L}$ may be given to the fifth wiring.

In the semiconductor device described in this embodiment, the transistor in which an oxide semiconductor is used for a channel formation region and in which the off-state current is extremely small is applied, whereby stored data can be held for an extremely long time. In other words, power consumption can be sufficiently reduced because refresh operation becomes unnecessary or the frequency of refresh operation can be sufficiently low. Moreover, stored data can be held for a long time even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of an insulating layer does not occur at all. In other words, the semiconductor device according to one embodiment of the disclosed invention does not have a limit on the number of times of writing which is a problem in a conventional non-volatile memory, and reliability thereof is drastically improved. Furthermore, data is written depending on the on state and the off state of the transistor, whereby high-speed operation can be easily achieved.

In addition, by employing the trench structure for the transistor 162, a reduction in the planar area of the transistor 162 can be achieved, so that high integration can be achieved. Further, in the transistor 162, since the upper end corner portions are sharp corner portions, in regions of the oxide semiconductor film, which are formed in contact with the upper end corner portions where parts of the source region and the drain region are formed, a growth surface of a crystal having the c-axis which is substantially perpendicular to a surface of the oxide semiconductor film might have low continuity. However, since the regions of the oxide semiconductor film, which are in contact with the upper end corner portions, are used for the source region and the drain region and not used for the channel formation region, a growth surface of a crystal having the c-axis which is substantially perpendicular to the surface of the oxide semiconductor film are continuous in the whole channel formation region. Thus, the transistor can have more stable electric characteristics.

The source region and the drain region have higher impurity concentrations than the channel formation region. Since resistance is decreased as the impurity concentration is increased, excellent ohmic contact can be obtained between the oxide semiconductor film and the source electrode layer and the drain electrode layer.

Further, variation in electric characteristics of the transistor can be reduced, which results in improvement of the electric characteristics. In addition, a semiconductor device in which a short-channel effect is suppressed and miniaturization is achieved can be provided.

The structures, methods, and the like described in this embodiment can be combined as appropriate with any of the structures, methods, and the like described in the other embodiments.

Embodiment 5

In this embodiment, a semiconductor device which includes the transistor 162 described in Embodiment 1, which can hold stored data even when not powered, which does not have a limitation on the number of write cycles, and which has a structure different from the structure described in Embodiment 4, will be described with reference to FIGS. 8A and 8B and FIGS. 9A and 9B.

Figure 8A:
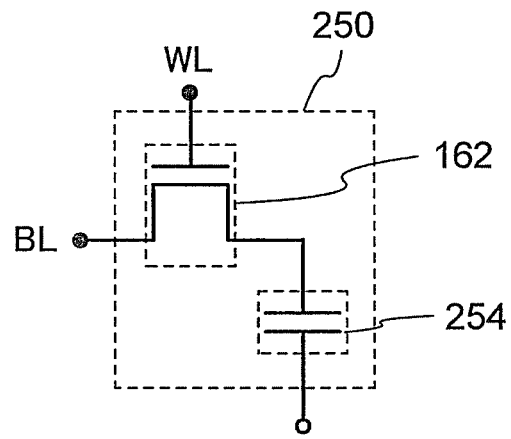
FIGS. 8A and 8B are a circuit diagram and a perspective view illustrating a semiconductor device according to one embodiment of the present invention.
Figure 8B:
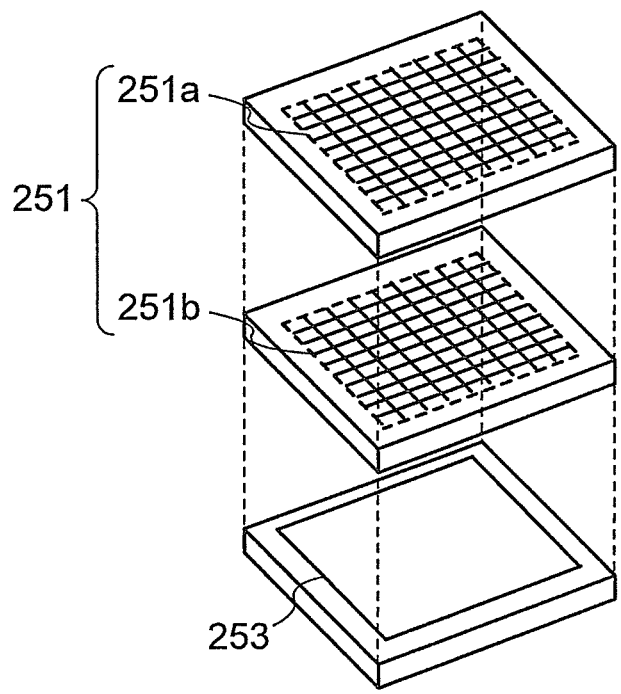

FIG. 8A illustrates an example of a circuit configuration of a semiconductor device, and FIG. 8B is a conceptual diagram illustrating an example of a semiconductor device. First, the semiconductor device illustrated in FIG. 8A will be described, and then, the semiconductor device illustrated in FIG. 8B will be described.

In the semiconductor device illustrated in FIG. 8A, a bit line BL is electrically connected to the source electrode layer or the drain electrode layer of the transistor 162, a word line WL is electrically connected to the gate electrode layer of the transistor 162, and the source electrode layer or the drain electrode layer of the transistor 162 is electrically connected to a first terminal of a capacitor 254.

The transistor 162 including an oxide semiconductor has extremely small off-state current. For that reason, a potential of the first terminal of the capacitor 254 (or a charge accumulated in the capacitor 254) can be held for an extremely long time by turning off the transistor 162. Further, in the transistor 162 including an oxide semiconductor, a short-channel effect is not likely to be caused, which is advantageous.

Next, writing and holding of data in the semiconductor device (a memory cell 250) illustrated in FIG. 8A will be described.

First, the potential of the word line WL is set to a potential at which the transistor 162 is turned on, so that the transistor 162 is turned on. Accordingly, the potential of the bit line BL is supplied to the first terminal of the capacitor 254 (writing of data). After that, the potential of the word line WL is set to a potential at which the transistor 162 is turned off, so that the transistor 162 is turned off. Thus, the potential of the first terminal of the capacitor 254 is held (holding of data).

Because the off-state current of the transistor 162 is extremely small, the potential of the first terminal of the capacitor 254 (or the charge accumulated in the capacitor) can be held for a long time.

Secondly, reading of data will be described. When the transistor 162 is turned on, the bit line BL which is in a floating state and the capacitor 254 are electrically connected to each other, and the charge is redistributed between the bit line BL and the capacitor 254. As a result, the potential of the bit line BL is changed. The amount of a change in potential of the bit line BL varies depending on the potential of the first terminal of the capacitor 254 (or the charge accumulated in the capacitor 254).

For example, the potential of the bit line BL after charge redistribution is $(C_B \times V_{B0} + C \times V)/(C_B + C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 8A can hold charge that is accumulated in the capacitor 254 for a long time because the off-state current of the transistor 162 is extremely small. In other words, power consumption can be sufficiently reduced because refresh operation becomes unnecessary or the frequency of refresh operation can be extremely low. Moreover, stored data can be held for a long time even when power is not supplied.

Next, the semiconductor device illustrated in FIG. 8B will be described.

The semiconductor device illustrated in FIG. 8B includes memory cell arrays 251a and 251b including a plurality of memory cells 250 illustrated in FIG. 8A as a memory circuit in an upper portion, and a peripheral circuit 253 in a lower portion which is necessary for operation of the memory cell array 251 (memory cell arrays 251a and 251b). Note that the peripheral circuit 253 is electrically connected to the memory cell array 251.

In the structure illustrated in FIG. 8B, the peripheral circuit 253 can be provided under the memory cell array 251 (memory cell arrays 251a and 251b). Thus, the size of the semiconductor device can be decreased.

It is preferable that a semiconductor material of a transistor provided in the peripheral circuit 253 be different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Thus, a variety of circuits (e.g., a logic circuit or a driver circuit) which needs to operate at high speed can be favorably realized by the transistor.

Note that FIG. 8B illustrates, as an example, the semiconductor device in which two memory cell arrays 251 (memory cell arrays 251a and 251b) are stacked; however, the number of memory cells to be stacked is not limited thereto. Three or more memory cells may be stacked.

Next, a specific structure of the memory cell 250 illustrated in FIG. 8A will be described with reference to FIGS. 9A and 9B.

Figure 9A:
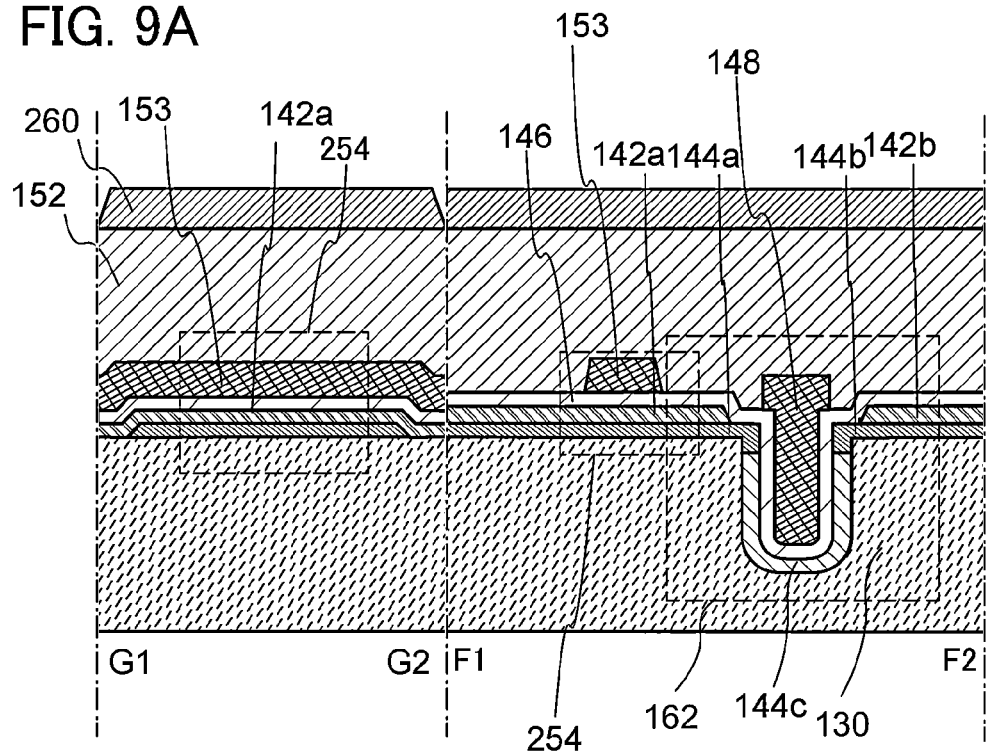
FIGS. 9A and 9B are a cross-sectional view and a plan view illustrating a semiconductor device according to one embodiment of the present invention.
Figure 9B:
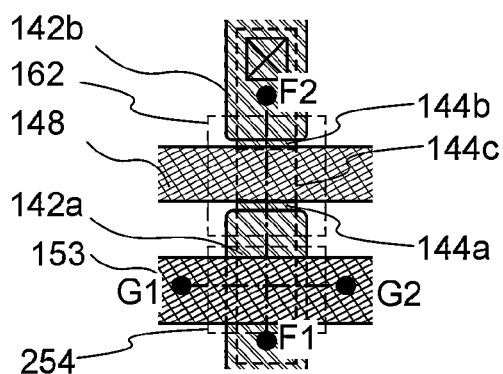

FIGS. 9A and 9B illustrate an example of a structure of the memory cell 250. FIG. 9A illustrates cross sections of the memory cell 250, and FIG. 9B is a plan view of the memory cell 250. Here, FIG. 9A illustrates cross sections taken along line F1-F2 and line G1-G2 in FIG. 9B.

The structure of the transistor 162 illustrated in FIGS. 9A and 9B is the same as that described in Embodiment 1; thus, for description of FIGS. 9A and 9B, the same reference numerals are used for the same parts as those in FIGS. 1A and 1B.

As illustrated in FIG. 9A, the transistor 162 includes the source region and the drain region of the oxide semiconductor film in contact with the upper end corner portion of the trench. Here, the oxide semiconductor film 144 is preferably highly purified by dehydration treatment or dehydrogenation treatment.

Treatment for adding an impurity is performed on the oxide semiconductor film 144, so that the source region 144a, the drain region 144b and the channel formation region 144c are provided.

The conductive layer 153 is provided in a region overlapping with the source electrode layer 142a of the transistor 162 with the gate insulating layer 146 provided therebetween; the capacitor 254 includes the source electrode layer 142a, the gate insulating layer 146, and the conductive layer 153. That is, the source electrode layer 142a of the transistor 162 functions as one electrode of the capacitor 254, and the conductive layer 153 functions as the other electrode of the capacitor 254. The conductive layer 153 can be formed through the same steps as the gate electrode layer 148.

The insulating layer 152 is provided over the transistor 162 and the capacitor 254. Further, a wiring 260 for connecting the memory cell 250 to an adjacent memory cell 250 is provided over the insulating layer 152. The wiring 260 is electrically connected to the drain electrode layer 142b of the transistor 162 through an opening which is provided in the gate insulating layer 146, the insulating layer 152, or the like. Alternatively, the wiring 260 may be electrically connected to the drain electrode layer 142b through another conductive layer provided in the opening. Note that the wiring 260 corresponds to the bit line BL in the circuit diagram of FIG. 8A.

In FIGS. 9A and 9B, the drain electrode layer 142b of the transistor 162 also functions as a source electrode layer of the transistor included in the adjacent memory cell. With such a planar layout, the area occupied by the semiconductor device can be reduced; thus, high integration can be achieved.

As described above, the plurality of memory cells formed in multiple layers in the upper portion is formed using a transistor including the source region and the drain region of the oxide semiconductor film in contact with the upper end corner portion of the trench. Since the off-state current of the transistor is small, stored data can be held for a long time owing such a transistor. In other words, refresh operation becomes unnecessary or the frequency of the refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

The structures, methods, and the like described in this embodiment can be combined as appropriate with any of the structures, methods, and the like described in the other embodiments.

Embodiment 6

In this embodiment, the field-effect mobility of a transistor whose channel is formed in an oxide semiconductor film will be described with reference to FIG. 19.

The actually measured field-effect mobility of an insulated gate transistor can be lower than its ideal mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following Formula 4.

[Formula 4]

$$\mu = \mu_0 \exp\left(-\frac{E}{kT}\right) \quad (4)$$

Here, E represents the height of the potential barrier, k represents the Boltzmann constant, and T represents the absolute temperature. Further, on the assumption that the potential barrier is attributed to a defect, the height of the potential barrier can be expressed as Formula 5 according to the Levinson model.

[Formula 5]

$$E = \frac{e^2 N^2}{8 \varepsilon n} = \frac{e^2 N^2 t}{8 \varepsilon\, C_{ox} V_g} \quad (5)$$

Here, e represents the elementary electric charge, N represents the average defect density per unit area in a channel, $\varepsilon$ represents the dielectric constant of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer.

The drain current $I_d$ in a linear region is expressed as the following Formula 6.

[Formula 6]

$$I_d = \frac{W \mu V_g V_d C_{ox}}{L_1} \exp\left(-\frac{E}{kT}\right) \quad (6)$$

Here, $L_1$ represents the channel length and W represents the channel width, and $L_1$ and W are each 10 μm in this case. In addition, $V_d$ represents the drain voltage. When dividing both sides of the above equation by $V_g$ and then taking logarithms of both sides, the following Formula 7 is obtained.

[Formula 7]

$$\ln\left(\frac{I_d}{V_g}\right) = \ln\left(\frac{W \mu V_d C_{ox}}{L_1}\right) - \frac{E}{kT} = \ln\left(\frac{W \mu V_d C_{ox}}{L_1}\right) - \frac{e^3 N^2 t}{8kT\, \varepsilon\, C_{ox} V_g} \quad (7)$$

The right side of Formula 7 is a function of $V_g$. From the formula, it is found that the defect density N can be obtained from the slope of a line in which $\ln(I_d/V_g)$ as the ordinate and $1/V_g$ as the abscissa. That is, the defect density can be evaluated from the $I_d$–$V_g$ characteristics of the transistor. The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner or the like, $\mu_0$ can be calculated to be 120 cm$^2$V·s from Formula 4 and Formula 5. The measured mobility of an In—Sn—Zn oxide including a defect is approximately 40 cm$^2$V·s. However, assuming that no defect exists inside the semiconductor and at the interface between the semiconductor and an insulating layer, the mobility $\mu_0$ of the transistor is expected to be 120 cm$^2$V·s.

Note that even when no defect exists inside a semiconductor, scattering at an interface between a channel and a gate insulating layer affects the transport property of the transistor. In other words, the mobility $\mu_1$ at a position that is distance x away from the interface between the channel and the gate insulating layer can be expressed as the following Formula 8.

[Formula 8]

$$\frac{1}{\mu_1} = \frac{1}{\mu_0} + \frac{D}{B}\exp\left(-\frac{x}{l}\right) \quad (8)$$

Here, D represents the electric field in the gate direction, and B and l are constants. The values of B and l can be obtained from actual measurement results; according to the above measurement results, B is $4.75 \times 10^7$ cm/s and l is 10 nm (the depth to which the influence of interface scattering reaches). When D is increased (i.e., when the gate voltage is increased), the second term of Formula 8 is increased and accordingly the mobility $\mu_1$ is decreased.

Figure 19:
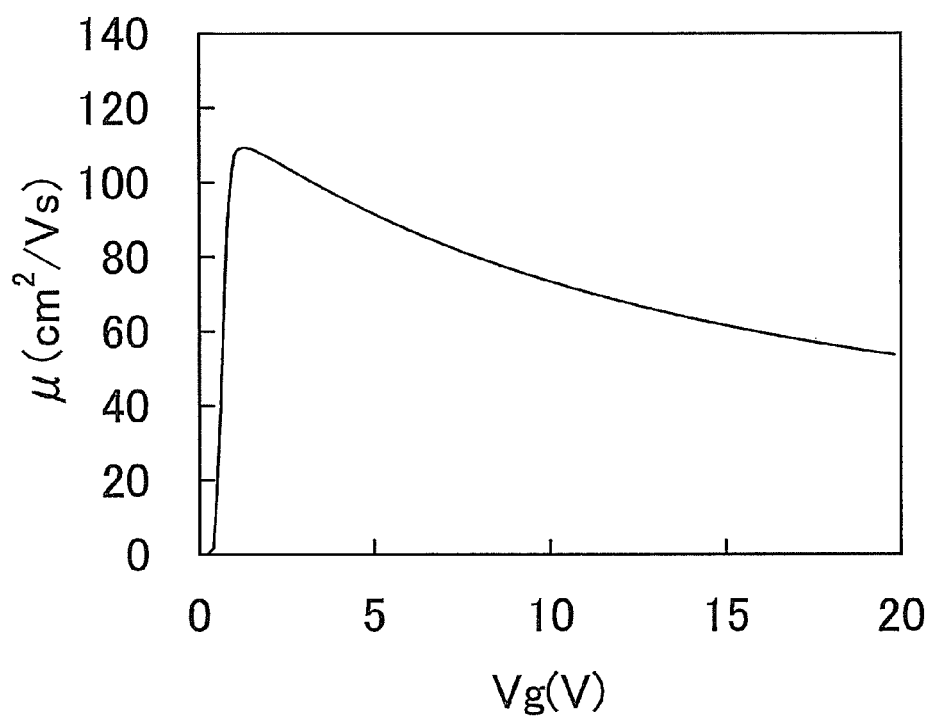
FIG. 19 is a graph showing gate voltage dependence of mobility obtained by calculation.

Calculation results of the mobility $\mu_2$ of a transistor whose channel includes an ideal oxide semiconductor film without a defect inside the semiconductor are shown in FIG. 19. For the calculation, device simulation software Sentaurus Device manufactured by Synopsys, Inc. was used, and the band gap, the electron affinity, the relative dielectric constant, and the thickness of the oxide semiconductor were assumed to be 2.8 eV, 4.7 eV, 15, and 15 nm, respectively. Further, the work functions of a gate electrode layer, a source electrode layer, and a drain electrode layer were assumed to be 5.5 eV, 4.6 eV, and 4.6 eV, respectively. The thickness of a gate insulating film was assumed to be 100 nm, and the relative dielectric constant thereof was assumed to be 4.1. The channel length and the channel width were each assumed to be 10 μm, and the drain voltage $V_d$ was assumed to be 0.1 V.

As shown in FIG. 19, the mobility has a peak of higher than or equal to 100 cm$^2$V·s at a gate voltage that is a little over 1 V and is decreased as the gate voltage becomes higher because the influence of interface scattering is increased. Note that in order to reduce the interface scattering, it is desirable that a surface of the semiconductor layer be flat at the atomic level (atomic layer flatness).

Calculation results of characteristics of minute transistors formed using an oxide semiconductor having such a mobility are shown in FIGS. 20A to 20C, FIGS. 21A to 21C, and FIGS. 22A to 22C. FIGS. 23A and 23B illustrate cross-sectional structures of the transistors used for the calculation. The transistors illustrated in FIGS. 23A and 23B each include a semiconductor region 303a and a semiconductor region 303c which have n$^+$-type conductivity in an oxide semiconductor film. The resistivities of the semiconductor region 303a and the semiconductor region 303c are 2×10$^{-3}$ Ωcm.

The transistor illustrated in FIG. 23A is formed over a base insulating layer 301 and an embedded insulating layer 302 which is embedded in the base insulating layer 301 and formed of aluminum oxide. The transistor includes the semiconductor region 303a, the semiconductor region 303c, an intrinsic semiconductor region 303b serving as a channel formation region provided therebetween and a gate electrode layer 305. The width of the gate electrode layer 305 is 33 nm.

A gate insulating layer 304 is formed between the gate electrode layer 305 and the semiconductor region 303b. In addition, a sidewall insulating layer 306a and a sidewall insulating layer 306b are formed on both side surfaces of the gate electrode layer 305, and an insulating layer 307 is formed over the gate electrode layer 305 so as to prevent a short circuit between the gate electrode layer 305 and another wiring. The sidewall insulating layer has a width of 5 nm. A source electrode layer 308a and a drain electrode layer 308b are provided in contact with the semiconductor region 303a and the semiconductor region 303c, respectively. Note that the channel width of this transistor is 40 nm.

The transistor in FIG. 23B is the same as the transistor in FIG. 23A in that it is formed over the base insulating layer 301 and the embedded insulating layer 302 formed of aluminum oxide and that it includes the semiconductor region 303a, the semiconductor region 303c, the intrinsic semiconductor region 303b provided therebetween, the gate electrode layer 305 having a width of 33 nm, the gate insulating layer 304, the sidewall insulating layer 306a, the sidewall insulating layer 306b, the insulating layer 307, the source electrode layer 308a, and the drain electrode layer 308b.

The transistor illustrated in FIG. 23A is different from the transistor illustrated in FIG. 23B in the conductivity type of semiconductor regions under the sidewall insulating layer 306a and the sidewall insulating layer 306b. In the transistor illustrated in FIG. 23A, the semiconductor regions under the sidewall insulating layer 306a and the sidewall insulating layer 306b are part of the semiconductor region 303a having n$^+$-type conductivity and part of the semiconductor region 303c having n$^+$-type conductivity, whereas in the transistor illustrated in FIG. 23B, the semiconductor regions under the sidewall insulating layer 306a and the sidewall insulating layer 306b are part of the intrinsic semiconductor region 303b. In other words, a region having a width of $L_{off}$ which overlaps with neither the semiconductor region 303a (semiconductor region 303c) nor the gate electrode layer 305 is provided. This region is called an offset region, and the width $L_{off}$ is called an offset length. As is seen from the drawing, the offset length is equal to the width of the sidewall insulating layer 306a (sidewall insulating layer 306b).

Figure 20A:
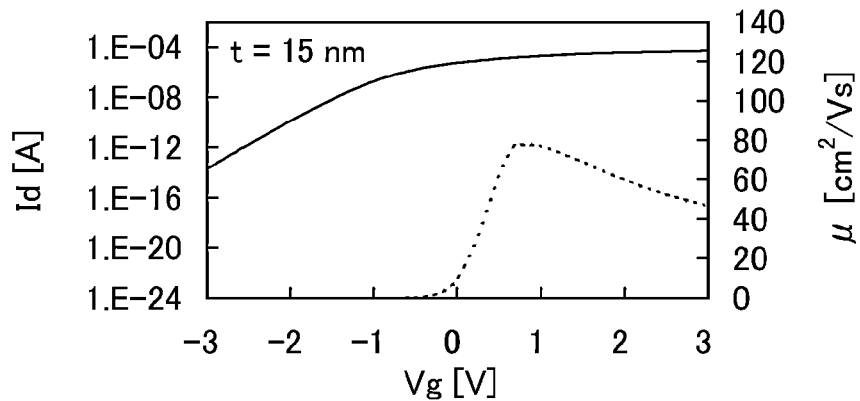
FIGS. 20A to 20C are graphs each showing gate voltage dependence of drain current and mobility, which is obtained by calculation.
Figure 20B:
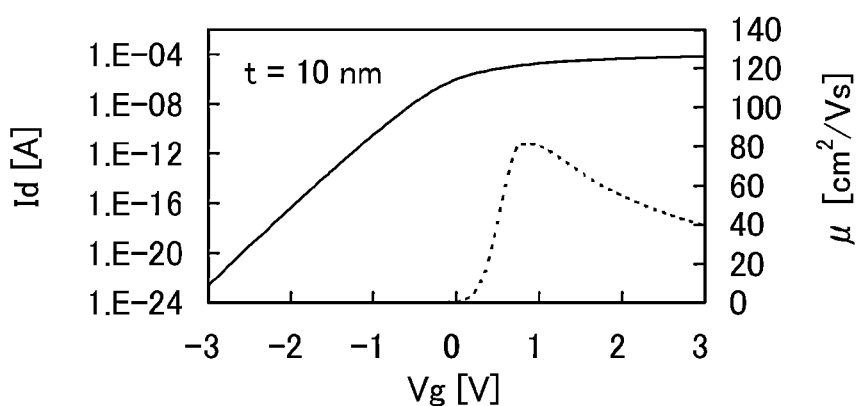
Figure 20C:
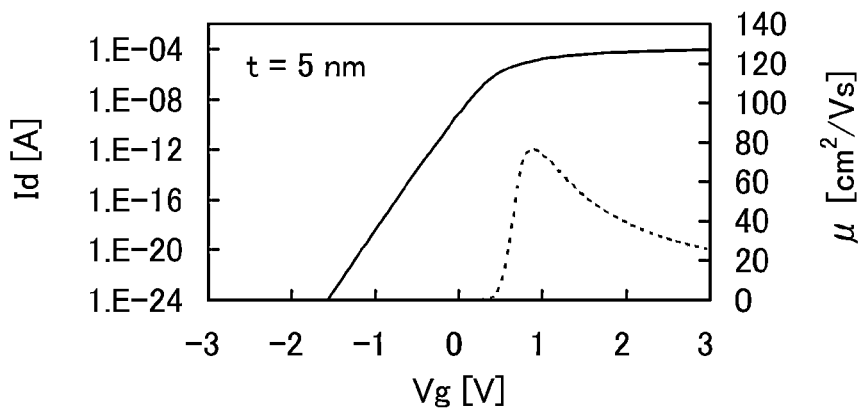

The other parameters used for the calculation are as described above. For the calculation, device simulation software Sentaurus Device manufactured by Synopsys, Inc. was used. FIGS. 20A to 20C show the gate voltage ($V_g$: a potential difference between the gate electrode layer and the source electrode layer) dependence of the drain current ($I_d$, a solid line) and the mobility ($\mu$, a dotted line) of the transistor having the structure illustrated in FIG. 23A. The drain current $I_d$ is obtained by calculation under the assumption that the drain voltage (a potential difference between the drain electrode layer and the source electrode layer) is +1 V and the mobility $\mu$ is obtained by calculation under the assumption that the drain voltage is +0.1 V.

FIG. 20A shows the gate voltage dependence of the transistor in the case where the thickness of the gate insulating layer is 15 nm, FIG. 20B shows that of the transistor in the case where the thickness of the gate insulating layer is 10 nm, and FIG. 20C shows that of the transistor in the case where the thickness of the gate insulating layer is 5 nm. As the gate insulating layer is thinner, the drain current $I_d$ (off-state current) particularly in an off state is significantly decreased. In contrast, there is no noticeable change in the peak value of the mobility $\mu$ and the drain current $I_d$ in an on state (on-state current). The graphs show that the drain current exceeds 10 μA, which is required in a memory element and the like, at a gate voltage of around 1 V.

Figure 21A:
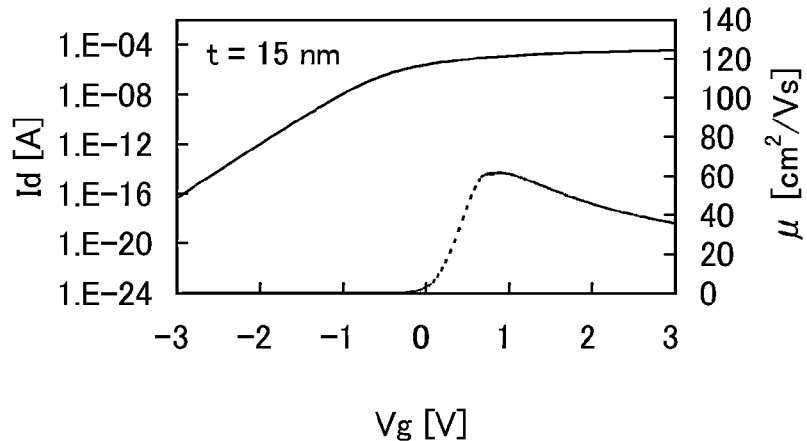
FIGS. 21A to 21C are graphs each showing gate voltage dependence of drain current and mobility, which is obtained by calculation.
Figure 21B:
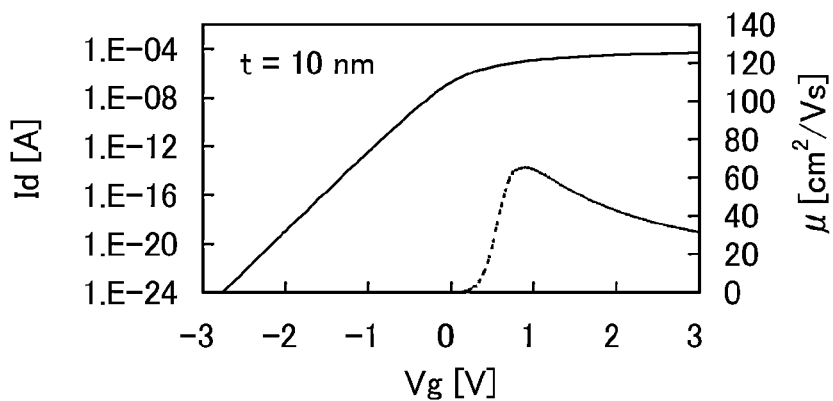
Figure 21C:
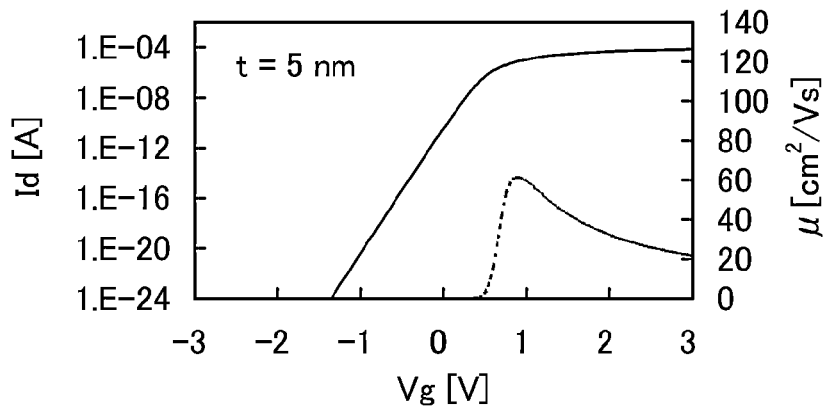

FIGS. 21A to 21C show the gate voltage $V_g$ dependence of the drain current $I_d$ (a solid line) and the mobility $\mu$ (a dotted line) of the transistor having the structure illustrated in FIG. 23B where the offset length $L_{off}$ is 5 nm. The drain current $I_d$ is obtained by calculation under the assumption that the drain voltage is +1 V and the mobility $\mu$ is obtained by calculation under the assumption that the drain voltage is +0.1 V. FIG. 21A shows the gate voltage dependence of the transistor in the case where the thickness of the gate insulating layer is 15 nm, FIG. 21B shows that of the transistor in the case where the thickness of the gate insulating layer is 10 nm, and FIG. 21C shows that of the transistor in the case where the thickness of the gate insulating layer is 5 nm.

Figure 22A:
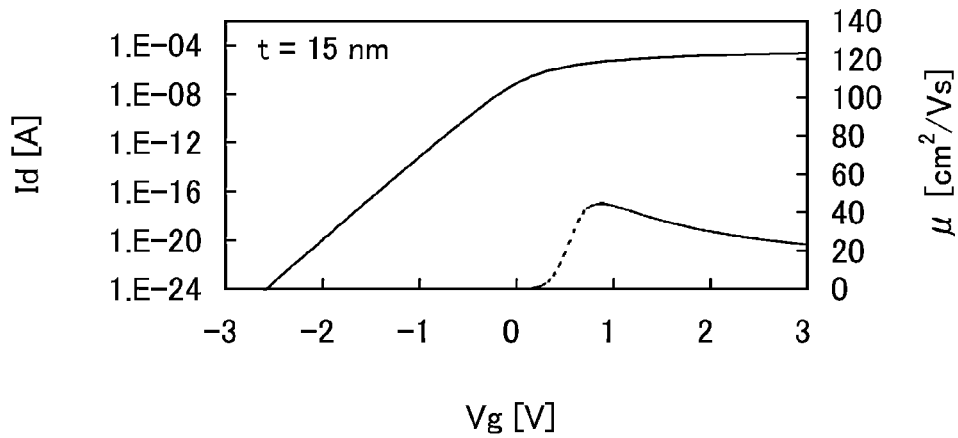
FIGS. 22A to 22C are graphs each showing gate voltage dependence of drain current and mobility, which is obtained by calculation.
Figure 22B:
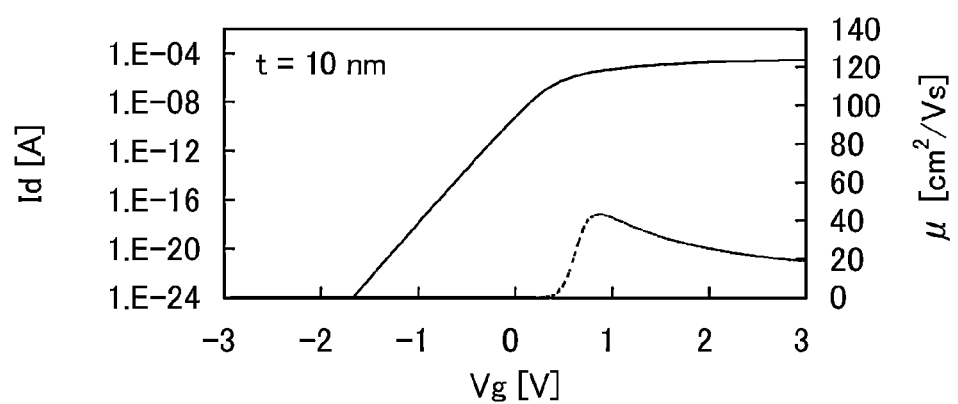
Figure 22C:
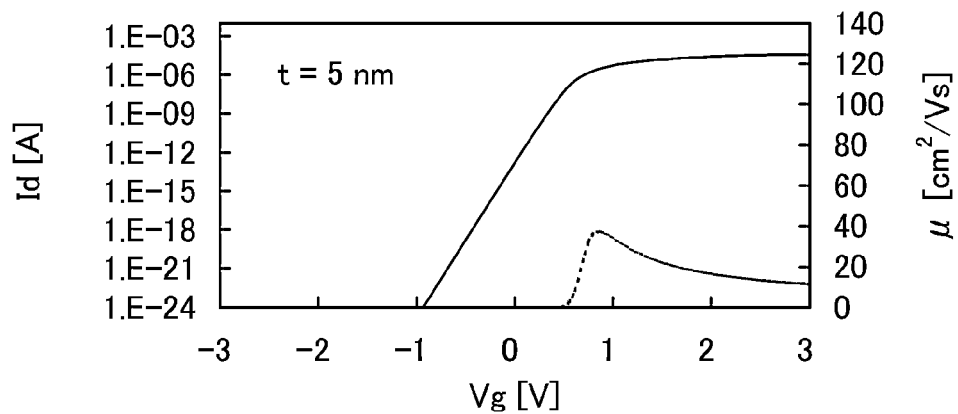
Figure 23A:
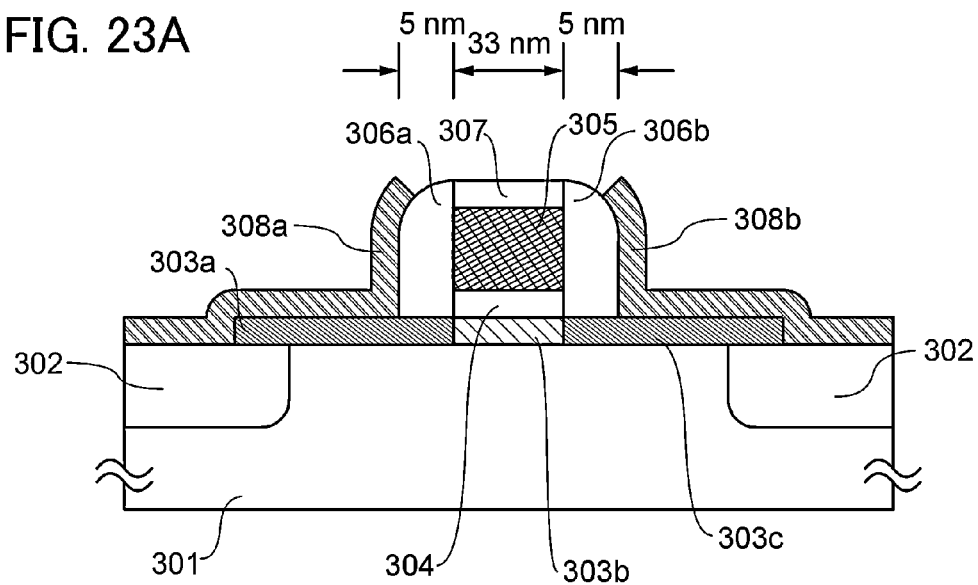
FIGS. 23A and 23B are diagrams each illustrating a cross-sectional structure of a transistor used in calculation.
Figure 23B:
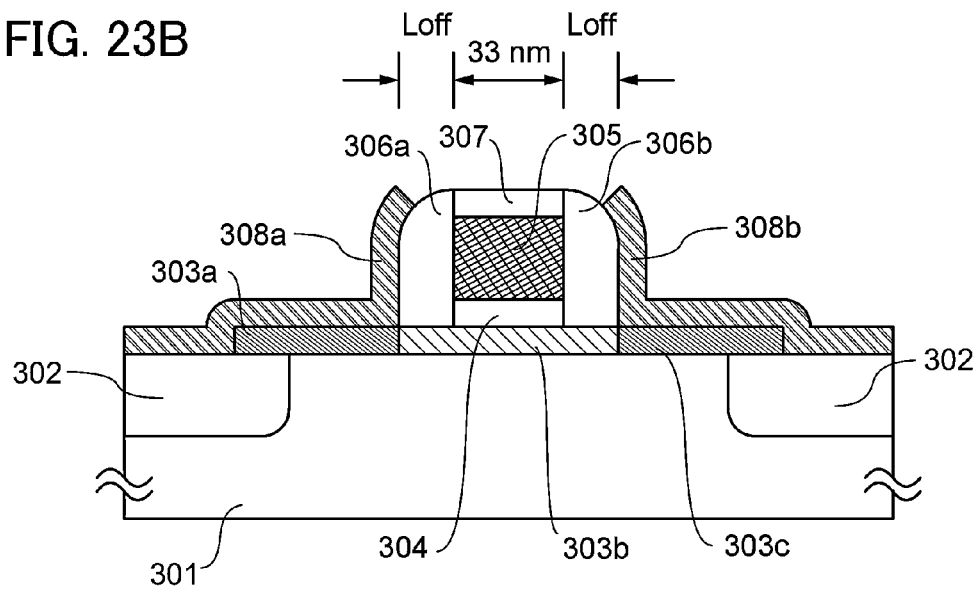

Further, FIGS. 22A to 22C show the gate voltage dependence of the drain current $I_d$ (a solid line) and the mobility $\mu$ (a dotted line) of the transistor having the structure illustrated in FIG. 23B where the offset length $L_{off}$ is 15 nm. The drain current $I_d$ is obtained by calculation under the assumption that the drain voltage is +1 V and the mobility $\mu$ is obtained by calculation under the assumption that the drain voltage is +0.1 V. FIG. 22A shows the gate voltage dependence of the transistor in the case where the thickness of the gate insulating layer is 15 nm, FIG. 22B shows that of the transistor in the case where the thickness of the gate insulating layer is 10 nm, and FIG. 22C shows that of the transistor in the case where the thickness of the gate insulating layer is 5 nm.

In either of the structures, as the gate insulating layer is thinner, the off-state current is significantly decreased, whereas no noticeable change arises in the peak value of the mobility $\mu$ and the on-state current.

Note that the peak of the mobility $\mu$ is approximately 80 cm$^2$V·s in FIGS. 20A to 20C, approximately 60 cm$^2$/V·s in FIGS. 21A to 21C, and approximately 40 cm$^2$V·s in FIGS. 22A to 22C; thus, the peak of the field-effect mobility $\mu$ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 µA, which is required in a memory element and the like, at a gate voltage of around 1 V.

The structures, methods, and the like described in this embodiment can be combined as appropriate with any of the structures, methods, and the like described in the other embodiments.

Embodiment 7

In this embodiment, examples of application of the semiconductor device described in any of the above embodiments to portable devices such as mobile phones, smartphones, or e-book readers will be described with reference to FIGS. 10A and 10B, FIG. 11, FIG. 12, and FIG. 13.

In a portable device such as a mobile phone, a smartphone, or an e-book reader, an SRAM or a DRAM is used so as to store image data temporarily. The reason why an SRAM or a DRAM is used is that a flash memory is slow in responding and is not suitable for image processing. However, an SRAM or a DRAM has the following features when used for temporary storage of image data.

Figure 10A:
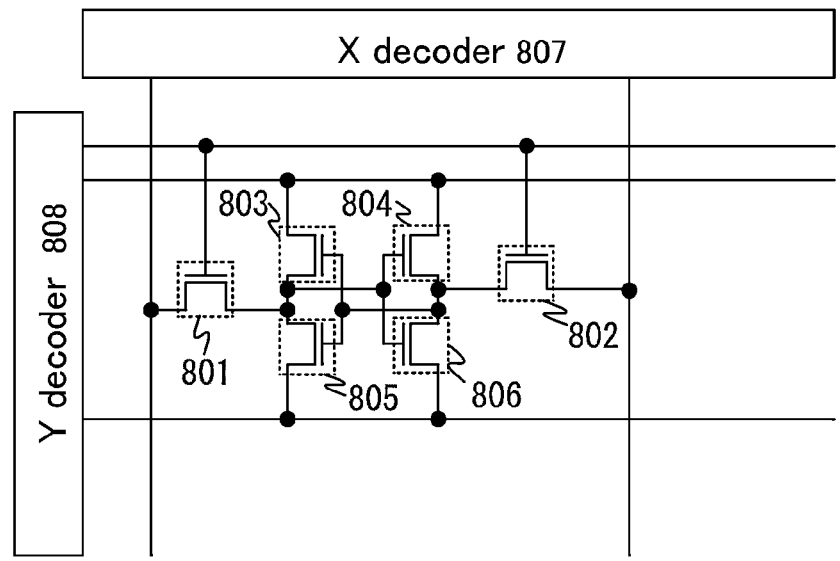
FIGS. 10A and 10B are circuit diagrams each illustrating a semiconductor device according to one embodiment of the present invention.

In a normal SRAM, as illustrated in FIG. 10A, one memory cell includes six transistors, which are a transistor 801, a transistor 802, a transistor 803, a transistor 804, a transistor 805, and a transistor 806, and they are driven by an X decoder 807 and a Y decoder 808. The transistors 803 and 805 and the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, a price per bit of an SRAM is the most expensive among a variety of memory devices.

Figure 10B:
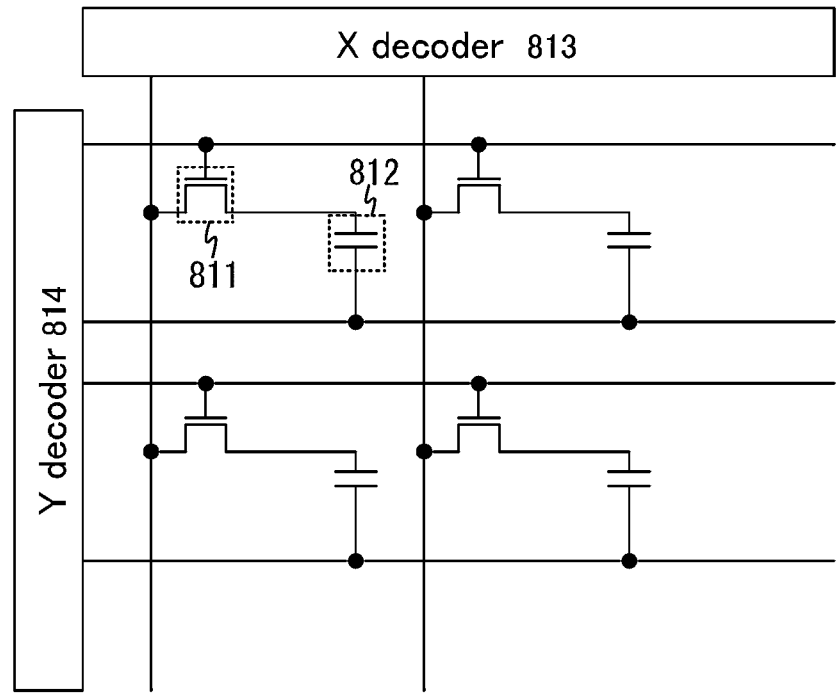

On the other hand, as illustrated in FIG. 10B, a memory cell in a DRAM includes a transistor 811 and a storage capacitor 812, and is driven by an X decoder 813 and a Y decoder 814. One cell includes one transistor and one capacitor and thus the area of a memory cell is small. The area of a memory cell of a DRAM is generally less than or equal to 10 $F^2$. Note that the DRAM needs to be refreshed periodically and consumes electric power even when a rewriting operation is not performed.

However, the area of the memory cell of the semiconductor device described in any of the above embodiments is about 10 $F^2$ and frequent refresh operations are not needed. Therefore, the area of the memory cell is reduced, and the power consumption can be reduced.

Figure 11:
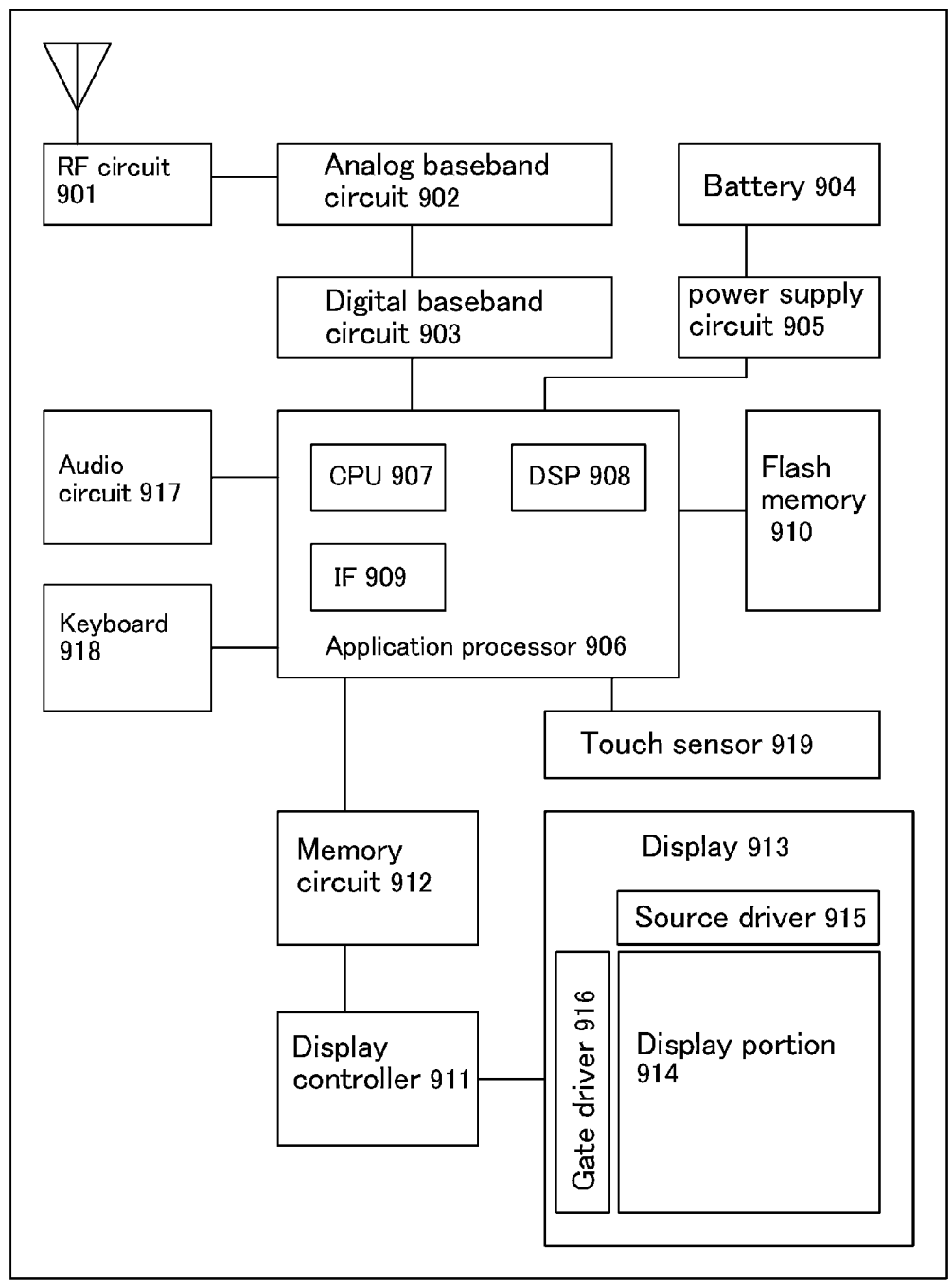
FIG. 11 is a block diagram illustrating a semiconductor device according to one embodiment of the present invention.

Next, a block diagram of a portable device is illustrated in FIG. 11. A portable device illustrated in FIG. 11 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface 909 (IF 909). In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced.

Figure 12:
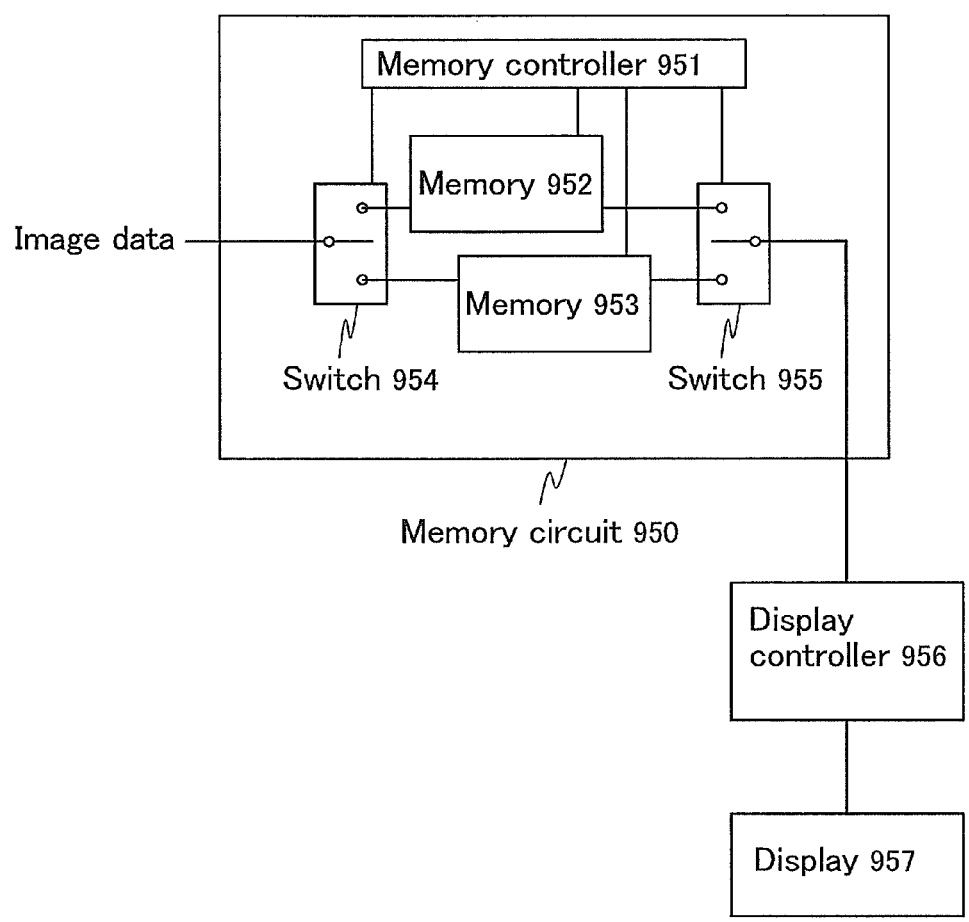
FIG. 12 is a block diagram illustrating a semiconductor device according to one embodiment of the present invention.

Next, FIG. 12 shows an example in which the semiconductor device described in any of the above embodiments is used for a memory circuit 950 in a display. The memory circuit 950 illustrated in FIG. 12 includes a memory 952, a memory 953, a switch 954, a switch 955, and a memory controller 951. Further, the memory circuit 950 is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not illustrated). The input image data A is stored in the memory 952 through the switch 954. Then, the image data stored in the memory 952 (stored image data A) is transmitted to the display 957 through the switch 955 and the display controller 956, and is displayed on the display 957.

In the case where the input image data A is not changed, the stored image data A is read from the memory 952 through the switch 955 by the display controller 956 normally at a frequency of approximately 30 Hz to 60 Hz.

Next, for example, when a user performs an operation to rewrite a screen (i.e., when the input image data A is changed), the application processor produces new image data (input image data B). The input image data B is stored in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is stored in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and stored for a long time, and power consumption can be sufficiently reduced.

Figure 13:
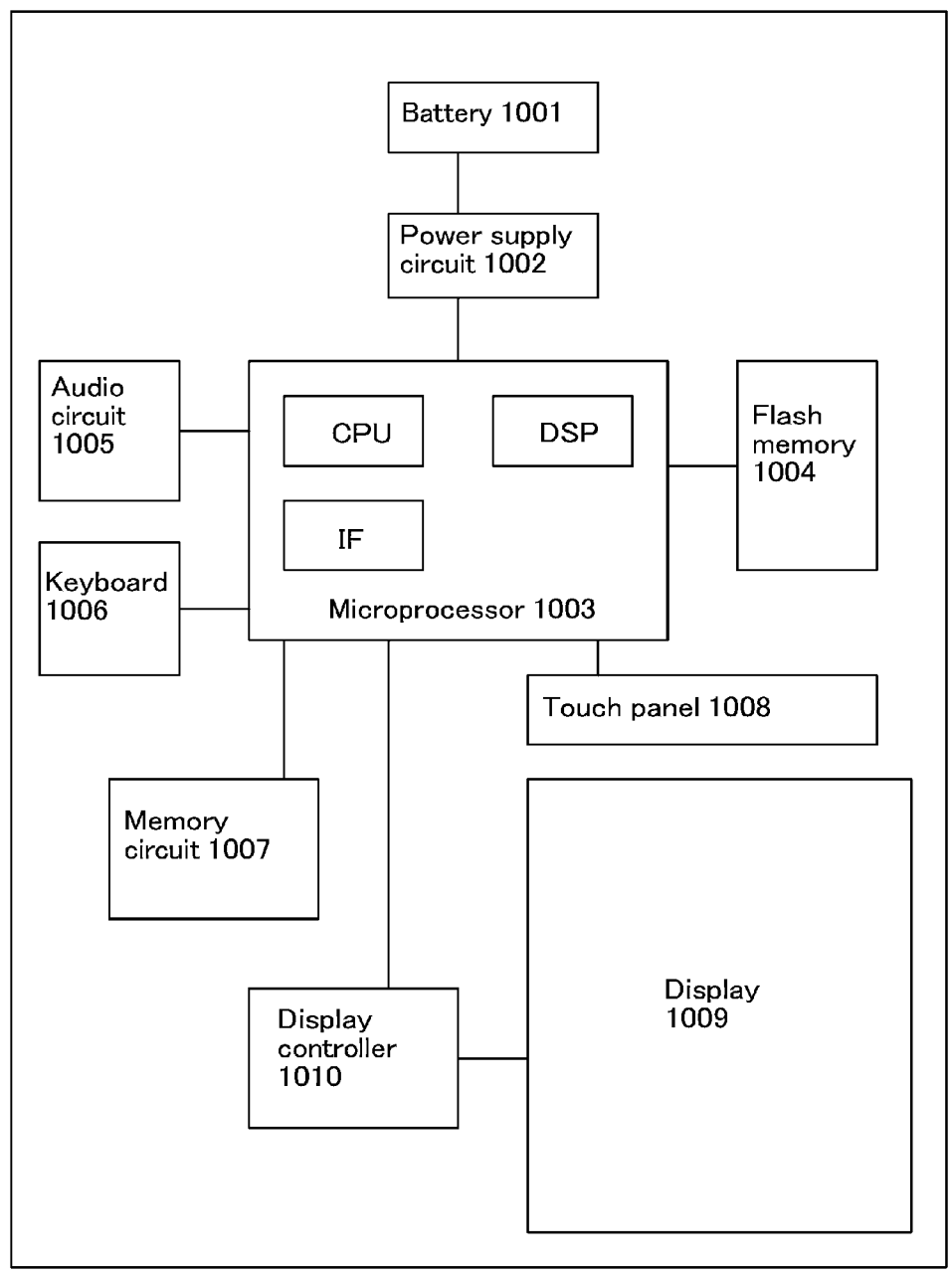
FIG. 13 is a block diagram illustrating a semiconductor device according to one embodiment of the present invention.

Next, FIG. 13 is a block diagram of an e-book reader. FIG. 13 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 13. The memory circuit 1007 has a function of temporarily storing the contents of a book. For example, a user may use a highlight function. In some cases, a user wants to mark a specific portion while reading an e-book reader. This marking function is called a highlight function and is used to make a difference from the other portions by changing the display color, underlining, making characters bold, changing the font of characters, or the like. The function makes it possible to store and hold data of a portion specified by a user. In order to store the data for a long time, the data may be copied to the flash memory 1004. Also in such a case, the semiconductor device described in any of the above embodiments is used, whereby writing and reading of data can be performed at high speed, data can be stored for a long time, and power consumption can be sufficiently reduced.

As described above, the portable devices described in this embodiment each incorporates the semiconductor device according to any of the above embodiments. Thus, it is possible to obtain a portable device which is capable of reading data at high speed, storing data for a long time, and reducing power consumption.

The structures, methods, and the like described in this embodiment can be combined as appropriate with any of the structures, methods, and the like described in the other embodiments.

EXAMPLE

In this example, samples in each of which a trench was formed in an insulating layer and an oxide semiconductor film was formed in the trench as described in Embodiment 1 were manufactured, and the crystal state of the oxide semiconductor film was observed.

First, two kinds of samples, an example sample 1 and an example sample 2, were manufactured as the samples through different manufacturing processes.

In each of the example sample 1 and the example sample 2, a silicon oxide film having a thickness of 500 nm was formed as the insulating layer over a silicon substrate by a sputtering method.

The silicon oxide film was formed using a silicon oxide ($SiO_2$) target as a target under the conditions where the distance between the silicon substrate and the target was 60 mm, the pressure was 0.4 Pa, the power of the power source was 2 kW, the atmosphere was an argon and oxygen atmosphere (the argon flow rate was 25 sccm, and the oxygen flow rate was 25 sccm), and the substrate temperature was 100° C.

A resist mask was formed over the silicon oxide film through a photolithography process, and the trench was formed by etching the silicon oxide film using the resist mask. The etching step was performed using an inductively coupled plasma (ICP) etching method under the conditions where the etching gas was trifluoromethane ($CHF_3$), helium (He), and methane ($CH_4$) ($CHF_3$:He:$CH_4$=22.5 sccm:127.5 sccm:5 sccm), the power of the power source was 475 W, the bias power was 300 W, the pressure was 3.5 Pa, and the treatment time was 96 seconds. Note that the etching step was followed by ashing with oxygen (with a power of the power source of 200 W under a pressure of 67 Pa (0.5 Torr) for 300 seconds). In a cross section of the trench, the sum of twice the length of the side surface (inner wall) (the depth d of the trench 131 in FIG. 1B) and the length of the bottom (the channel length L of the trench 131 in FIG. 1B) was about 350 nm.

The resist mask was removed from above the silicon oxide film using a stripping solution, and the oxide semiconductor film was formed on the silicon oxide film in contact with a bottom surface, an upper end corner portion, a lower end corner portion, and a side surface of the trench. An In—Ga—Zn—O film having a thickness of 40 nm was formed as the oxide semiconductor film by a sputtering method.

In the example sample 1, the oxide semiconductor film was formed while the substrate was heated to 400° C. Note that the In—Ga—Zn—O film in the example sample 1 was formed using an oxide target having a composition ratio of In:Ga:Zn=1:1:1 in an atomic ratio under the conditions where the distance between the silicon substrate and the target was 60 mm, the pressure was 0.4 Pa, the direct-current (DC) power was 0.5 kW, the atmosphere was an argon and oxygen atmosphere (the argon flow rate was 30 sccm, and the oxygen flow rate was 15 sccm), and the substrate temperature was 400° C.

It is preferable that an argon and oxygen atmosphere used for formation of the oxide semiconductor film do not contain water, hydrogen, and the like. For example, it is preferable that argon have a purity of 9N, a dew point of −121° C., a water content of 0.1 ppb, and a hydrogen content of 0.5 ppb and oxygen have a purity of 8N, a dew point of −112° C., a water content of 1 ppb, and a hydrogen content of 1 ppb.

On the other hand, in the example sample 2, the oxide semiconductor film was formed while the substrate was heated to 200° C., and then subjected to heat treatment at 600° C. for one hour in a nitrogen atmosphere. Note that the In—Ga—Zn—O film in the example sample 2 was formed using an oxide target having a composition ratio of In:Ga:Zn=1:1:1 in an atomic ratio under the conditions where the distance between the silicon substrate and the target was 60 mm, the pressure was 0.4 Pa, the direct-current (DC) power was 0.5 kW, and the atmosphere was an argon and oxygen atmosphere (the argon flow rate was 30 sccm, and the oxygen flow rate was 15 sccm).

Figure 14A:
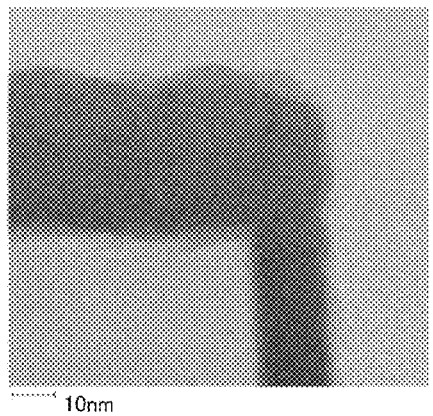
FIGS. 14A to 14D are TEM images of an example sample 1 in Example.
Figure 14C:
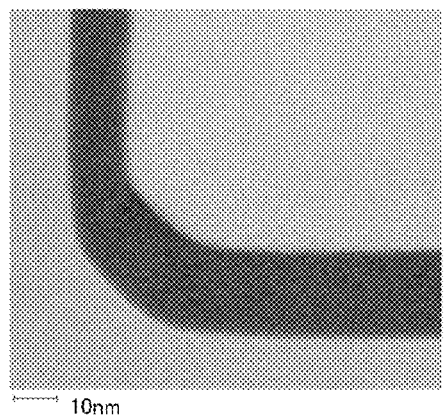
Figure 14B:
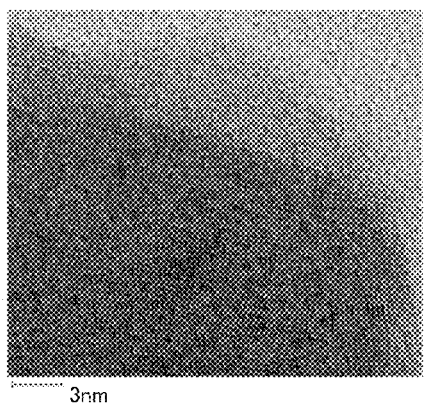
Figure 14D:
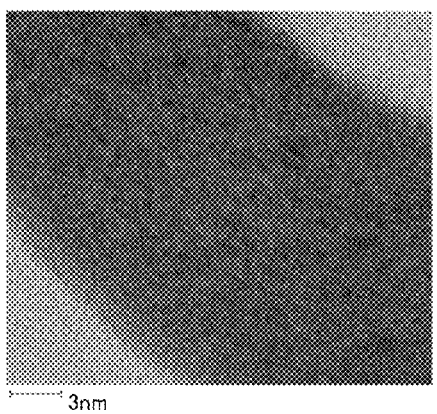
Figure 15A:
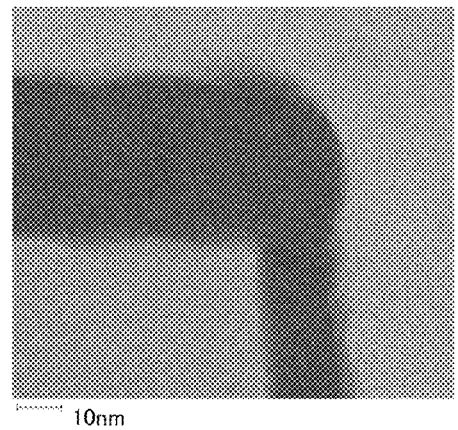
FIGS. 15A to 15D are TEM images of an example sample 2 in Example.
Figure 15C:
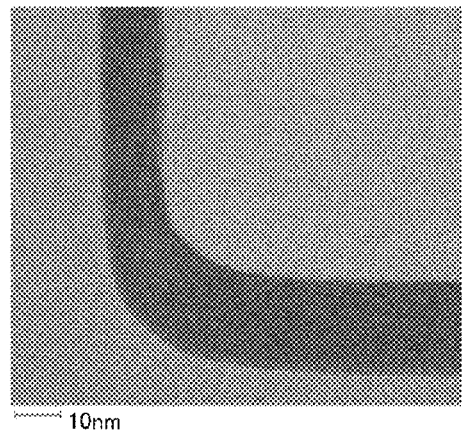
Figure 15B:
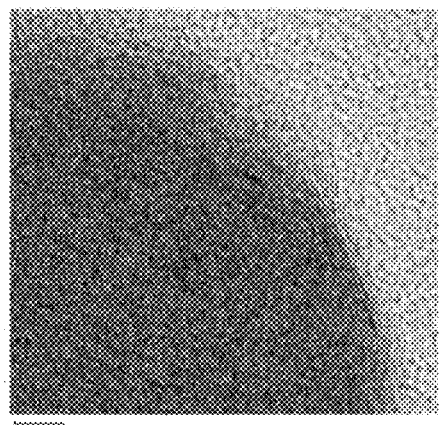
Figure 15D:
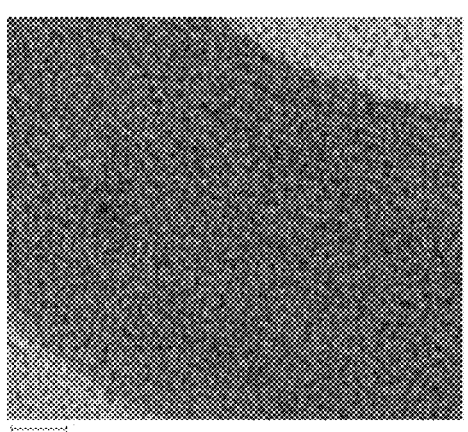

Each of the example sample 1 and the example sample 2 obtained through the above steps was cut to expose cross sections of the upper end corner portion and the lower end corner portion, and the cross sections were observed with a high-resolution transmission electron microscope (TEM: "H9000-NAR" manufactured by Hitachi High-Technologies Corporation) at an acceleration voltage of 300 kV. FIG. 14A shows a TEM image of the upper end corner portion of the example sample 1 at a magnification of 2 million times. FIG. 14B shows a TEM image of the upper end corner portion of the example sample 1 at a magnification of 8 million times. FIG. 14C shows a TEM image of the lower end corner portion of the example sample 1 at a magnification of 2 million times. FIG. 14D shows a TEM image of the lower end corner portion of the example sample 1 at a magnification of 8 million times. FIG. 15A shows a TEM image of the upper end corner portion of the example sample 2 at a magnification of 2 million times. FIG. 15B shows a TEM image of the upper end corner portion of the example sample 2 at a magnification of 8 million times. FIG. 15C shows a TEM image of the lower end corner portion of the example sample 2 at a magnification of 2 million times. FIG. 15D shows a TEM image of the lower end corner portion of the example sample 2 at a magnification of 8 million times.

As shown in each of FIG. 14C and FIG. 15C, the lower end corner portion of the trench has a curved shape, and its curvature radius is longer than or equal to 20 nm and shorter than or equal to 30 nm. In the lower end corner portion having a curved shape, an In—Ga—Zn—O film (CAAC-OS film) including a crystal having the c-axis substantially perpendicular to a surface can be identified. The crystal having the c-axis substantially perpendicular to a surface is more clearly shown in FIGS. 14D and 15D at a higher magnification, and in the In—Ga—Zn—O film, layered crystalline In—Ga—Zn—O can be identified along the curved surface of the lower end corner portion.

However, as shown in FIG. 14A and FIG. 15A, a sharp corner portion can be observed in the upper end corner portion of the trench. Further, as shown in FIG. 14B and FIG. 15B at a higher magnification, an In—Ga—Zn—O film (CAAC-OS film) including a crystal having the c-axis which is substantially perpendicular to a surface of the In—Ga—Zn—O film is not able to be observed as in the lower end corner portion.

This confirms that the oxide semiconductor film formed in contact with the lower end corner portion of the trench in each of the example sample 1 and the example sample 2 is a crystalline oxide semiconductor film (CAAC-OS film) including a crystal having the c-axis which is substantially perpendicular to a surface of the crystalline oxide semiconductor film, and a growth surface of the CAAC-OS film has continuity over the lower end corner portion having a curved shape. On the other hand, less continuity of the growth surface of the CAAC-OS film can be observed in the oxide semiconductor film formed in contact with the upper end corner portion of the trench than in the oxide semiconductor film formed in contact with the lower end corner portion of the trench.

In the lower end corner portion, the CAAC-OS film is provided in the trench, whereby a change in electric characteristics of the transistor due to irradiation with visible light or ultraviolet light and a short-channel effect can be further suppressed.

Further, less continuity of the grow surface of the CAAC-OS film is observed in the upper end corner portion than in the lower end corner portion; thus, a growth surface of a crystal might have low continuity.

However, since the regions of the oxide semiconductor film, which are in contact with the upper end corner portions, are used for the source region and the drain region and not used for the channel formation region as described in the above embodiment, a growth surface of a crystal having the c-axis which is substantially perpendicular to the surface of the oxide semiconductor film are continuous in the whole channel formation region. Thus, the transistor can have more stable electric characteristics.

The source region and the drain region have higher impurity concentrations than the channel formation region. Since resistance is decreased as the impurity concentration is increased, excellent ohmic contact can be obtained between the oxide semiconductor film and the source electrode layer and the drain electrode layer.

Thus, variation in electric characteristics of the transistor can be reduced, which results in improvement of the electric characteristics. In addition, a semiconductor device in which a short-channel effect is suppressed and miniaturization is achieved can be provided.

This application is based on Japanese Patent Application serial no. 2011-106877 filed with Japan Patent Office on May 12, 2011, the entire contents of which are hereby incorporated by reference.

What is claimed is:

1. A method for manufacturing a semiconductor device, comprising the steps of:
    forming an insulating layer including a first region having a first thickness and a second region having a second thickness smaller than the first thickness, the insulating layer including a trench including a side surface and a bottom surface, the bottom surface being overlapped with the second region;
    forming an oxide semiconductor film in contact with the bottom surface and the side surface of the trench and a top surface of the first region and forming at least a region in contact with the side surface and the bottom surface of the trench to include a crystal having a c-axis substantially perpendicular to a surface of the oxide semiconductor film under a heating condition;
    forming a source region and a drain region in contact with the top surface of the first region and an upper end corner portion where the top surface of the first region intersects the side surface of the trench and forming a channel formation region in contact with the side surface and the bottom surface of the trench by adding impurities;
    forming a source electrode layer and a drain electrode layer electrically connected to the source region and the drain region;
    forming a gate insulating layer over the oxide semiconductor film, the source electrode layer, and the drain electrode layer; and
    forming a gate electrode layer over the gate insulating layer, the gate electrode layer overlapping with the trench,
    wherein the source region and the drain region have higher impurity concentrations than the channel formation region.

2. The method for manufacturing a semiconductor device according to claim 1, wherein the impurities are added obliquely with respect to a normal direction of the top surface of the first region by a plasma immersion ion implantation method or a plasma based ion implantation method.

3. The method for manufacturing a semiconductor device according to claim 1,
    wherein the trench has a curved surface at a lower end corner portion where the bottom surface intersects the side surface, and
    wherein a radius of curvature of the lower end corner portion is greater than or equal to 20 nm and less than or equal to 60 nm.

4. A method for manufacturing a semiconductor device, comprising the steps of:
    forming an insulating layer including a first region having a first thickness and a second region having a second thickness smaller than the first thickness, the insulating layer including a trench including a side surface and a bottom surface, the bottom surface being overlapped with the second region;
    forming an amorphous oxide semiconductor film in contact with the bottom surface and the side surface of the trench and a top surface of the first region;
    forming at least a region which is in contact with the side surface and the bottom surface of the trench to include a crystal having a c-axis which is substantially perpendicular to a surface of the amorphous oxide semiconductor film by heating the amorphous oxide semiconductor film;
    forming a source region and a drain region in contact with the top surface of the first region and an upper end corner portion where the top surface of the first region intersects the side surface of the trench and forming a channel formation region in contact with the side surface and the bottom surface of the trench by adding impurities;
    forming a source electrode layer and a drain electrode layer electrically connected to the source region and the drain region;
    forming a gate insulating layer over the amorphous oxide semiconductor film, the source electrode layer, and the drain electrode layer; and
    forming a gate electrode layer over the gate insulating layer, the gate electrode layer overlapping with the trench,
    wherein the source region and the drain region have higher impurity concentrations than the channel formation region.

5. The method for manufacturing a semiconductor device according to claim 4, wherein the impurities are added obliquely with respect to a normal direction of the top surface of the first region by a plasma immersion ion implantation method or a plasma based ion implantation method.

6. The method for manufacturing a semiconductor device according to claim 4,
    wherein the trench has a curved surface at a lower end corner portion where the bottom surface intersects the side surface, and wherein a radius of curvature of the lower end corner portion is greater than or equal to 20 nm and less than or equal to 60 nm.

7. A method for manufacturing a semiconductor device, comprising the steps of:
forming an insulating layer including a first region having a first thickness and a second region having a second thickness smaller than the first thickness, the insulating layer including a trench including a side surface and a bottom surface, the bottom surface being overlapped with the second region;
forming an oxide semiconductor film in contact with the bottom surface and the side surface of the trench and a top surface of the first region and forming at least a region in contact with the side surface and the bottom surface of the trench to include a crystal having a c-axis substantially perpendicular to a surface of the oxide semiconductor film under a heating condition;
forming a source electrode layer and a drain electrode layer over the oxide semiconductor film;
forming a gate insulating layer over the oxide semiconductor film, the source electrode layer, and the drain electrode layer;
forming a gate electrode layer which fills the trench and which is over the gate insulating layer so as to overlap with the trench; and
forming a source region and a drain region in contact with the top surface of the first region and an upper end corner portion where the top surface of the first region intersects the side surface of the trench and forming a channel formation region in contact with the side surface and the bottom surface of the trench by adding impurities through the gate electrode layer after the formation of the gate electrode layer,
wherein the source region and the drain region have higher impurity concentrations than the channel formation region.

8. The method for manufacturing a semiconductor device according to claim 7, wherein the impurities are added by a plasma immersion ion implantation method or a plasma based ion implantation method.

9. The method for manufacturing a semiconductor device according to claim 7,
wherein the trench has a curved surface at a lower end corner portion where the bottom surface intersects the side surface, and
wherein a radius of curvature of the lower end corner portion is greater than or equal to 20 nm and less than or equal to 60 nm.

10. The method for manufacturing a semiconductor device according to claim 7,
wherein a part whose impurity concentration is higher than impurity concentrations of the source region and the drain region is formed in the oxide semiconductor film not overlapping with the source electrode layer, the drain electrode layer, and the gate electrode layer.

11. A method for manufacturing a semiconductor device, comprising the steps of:
forming an insulating layer including a first region having a first thickness and a second region having a second thickness smaller than the first thickness, the insulating layer including a trench including a side surface and a bottom surface, the bottom surface being overlapped with the second region;
forming an amorphous oxide semiconductor film in contact with the bottom surface and the side surface of the trench and a top surface of the first region;
forming a source electrode layer and a drain electrode layer over the amorphous oxide semiconductor film;
forming a gate insulating layer over the amorphous oxide semiconductor film, the source electrode layer, and the drain electrode layer;
forming a gate electrode layer which fills the trench and which is over the gate insulating layer so as to overlap with the trench;
forming a source region and a drain region in contact with the top surface of the first region and an upper end corner portion where the top surface of the first region intersects the side surface of the trench and forming a channel formation region in contact with the side surface and the bottom surface of the trench by adding impurities through the gate electrode layer after the formation of the gate electrode layer; and
forming at least a region which is in contact with the side surface and the bottom surface of the trench to include a crystal having a c-axis which is substantially perpendicular to a surface of the amorphous oxide semiconductor film by heating the amorphous oxide semiconductor film after any one of a series of steps from the step of forming the amorphous oxide semiconductor film to the step of forming the gate electrode layer,
wherein the source region and the drain region have higher impurity concentrations than the channel formation region.

12. The method for manufacturing a semiconductor device according to claim 11, wherein the impurities are added by a plasma immersion ion implantation method or a plasma based ion implantation method.

13. The method for manufacturing a semiconductor device according to claim 11,
wherein the trench has a curved surface at a lower end corner portion where the bottom surface intersects the side surface, and
wherein a radius of curvature of the lower end corner portion is greater than or equal to 20 nm and less than or equal to 60 nm.

14. The method for manufacturing a semiconductor device according to claim 11,
wherein a part whose impurity concentration is higher than impurity concentrations of the source region and the drain region is formed in the amorphous oxide semiconductor film not overlapping with the source electrode layer, the drain electrode layer, or the gate electrode layer.

15. A method for manufacturing a semiconductor device, comprising the steps of:
forming an insulating layer including a first region having a first thickness and a second region having a second thickness smaller than the first thickness, the insulating layer including a trench including a side surface and a bottom surface, the bottom surface being overlapped with the second region;
forming an oxide semiconductor film in contact with the bottom surface and the side surface of the trench and a top surface of the first region and forming at least a region in contact with the side surface and the bottom surface of the trench to include a crystal having a c-axis substantially perpendicular to a surface of the oxide semiconductor film under a heating condition;
forming a resist mask covering the side surface and the bottom surface of the trench;
adding impurities to the oxide semiconductor film;
forming a source region and a drain region in contact with the top surface of the first region and an upper end corner portion where the top surface of the first region intersects the side surface of the trench and forming a channel formation region in contact with the side surface and the bottom surface of the trench;

removing the resist mask;

forming a source electrode layer and a drain electrode layer electrically connected to the source region and the drain region;

forming a gate insulating layer over the oxide semiconductor film, the source electrode layer, and the drain electrode layer; and forming a gate electrode layer which fills the trench and which is over the gate insulating layer so as to overlap with the trench, wherein the source region and the drain region have higher impurity concentrations than the channel formation region.

16. The method for manufacturing a semiconductor device according to claim 15, wherein the impurities are added by a plasma immersion ion implantation method or a plasma based ion implantation method.

17. The method for manufacturing a semiconductor device according to claim 15, wherein the trench has a curved surface at a lower end corner portion where the bottom surface intersects the side surface, and wherein a radius of curvature of the lower end corner portion is greater than or equal to 20 nm and less than or equal to 60 nm.

18. A method for manufacturing a semiconductor device, comprising the steps of:

forming an insulating layer including a first region having a first thickness and a second region having a second thickness smaller than the first thickness, the insulating layer including a trench including a side surface and a bottom surface, the bottom surface being overlapped with the second region;

forming an amorphous oxide semiconductor film in contact with the bottom surface and the side surface of the trench and a top surface of the first region;

forming a resist mask which covers the side surface and the bottom surface of the trench and which is in contact with the amorphous oxide semiconductor film;

adding impurities to the amorphous oxide semiconductor film;

forming a source region and a drain region in contact with the top surface of the first region and an upper end corner portion where the top surface of the first region intersects the side surface of the trench and forming a channel formation region in contact with the side surface and the bottom surface of the trench;

removing the resist mask;

forming a source electrode layer and a drain electrode layer electrically connected to the source region and the drain region;

forming a gate insulating layer over the amorphous oxide semiconductor film, the source electrode layer, and the drain electrode layer;

forming a gate electrode layer over the gate insulating layer, the gate electrode layer overlapping with the trench; and forming at least a region which is in contact with the side surface and the bottom surface of the trench to include a crystal having a c-axis which is substantially perpendicular to a surface of the amorphous oxide semiconductor film by heating the amorphous oxide semiconductor film after the step of forming the amorphous oxide semiconductor film, wherein the source region and the drain region have higher impurity concentrations than the channel formation region.

19. The method for manufacturing a semiconductor device according to claim 18, wherein the impurities are added by a plasma immersion ion implantation method or a plasma based ion implantation method.

20. The method for manufacturing a semiconductor device according to claim 18, wherein the trench has a curved surface at a lower end corner portion where the bottom surface intersects the side surface, and wherein a radius of curvature of the lower end corner portion is greater than or equal to 20 nm and less than or equal to 60 nm.

* * * * *